(12) United States Patent
Jung et al.

(10) Patent No.: US 10,672,447 B2
(45) Date of Patent: Jun. 2, 2020

(54) MEMORY DEVICE AND PROGRAMMING METHOD

(71) Applicant: Samsung Electronics Co., Ltd., Suwon-si, Gyeonggi-do (KR)

(72) Inventors: Hyunsung Jung, Hwaseong-si (KR); Hyemin Shin, Suwon-si (KR); Yoonjong Song, Seoul (KR); Jung Hyuk Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/262,366

(22) Filed: Jan. 30, 2019

(65) Prior Publication Data

US 2020/0005847 A1    Jan. 2, 2020

(30) Foreign Application Priority Data

Jun. 29, 2018    (KR) .......................... 10-2018-0075896

(51) Int. Cl.
*G11C 16/10* (2006.01)
*G11C 11/16* (2006.01)
*H01L 27/22* (2006.01)
*H01L 43/02* (2006.01)
*H01L 43/10* (2006.01)

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1659* (2013.01); *G11C 11/1673* (2013.01); *H01L 27/228* (2013.01); *H01L 43/02* (2013.01); *H01L 43/10* (2013.01)

(58) Field of Classification Search
CPC .............. G11C 11/1675; G11C 11/161; G11C 11/1655; G11C 11/1657; G11C 11/1659; G11C 11/1673; H01L 27/228
USPC ........................................................ 365/158
See application file for complete search history.

(56) References Cited

U.S. PATENT DOCUMENTS

| | | | |
|---|---|---|---|
| 7,050,325 B2 | 5/2006 | Iwata et al. | |
| 7,158,406 B2 | 1/2007 | Iwata | |
| 7,936,592 B2 | 5/2011 | Wang et al. | |
| 8,169,818 B2 | 5/2012 | Ohmori et al. | |
| 8,593,853 B2 | 11/2013 | Katoh | |
| 8,665,649 B2* | 3/2014 | Park ................. | G11C 16/10 365/185.19 |

(Continued)

FOREIGN PATENT DOCUMENTS

| | | |
|---|---|---|
| JP | 4012196 | 11/2007 |
| JP | 3808799 | 8/2016 |
| KR | 10-2014-0103326 | 8/2014 |

*Primary Examiner* — Xiaochun L Chen
(74) *Attorney, Agent, or Firm* — Myers Bigel, P.A.

(57) ABSTRACT

Disclosed is a memory device. The memory device includes a memory cell array that includes a target cell, a row decoder that drive a word line, and a write driver and sense amplifier that are configured to drive a bit line and a source line. The row decoder is configured to drive the word line in a first program operation and a second program operation. Between a start of the first program operation and an end of the second program operation, the write driver and sense amplifier are configured to continuously drive a bit line connected to the target cell with a second driving voltage or drive a source line connected to the target cell with a third driving voltage.

19 Claims, 18 Drawing Sheets

(56) References Cited

U.S. PATENT DOCUMENTS

| | | |
|---|---|---|
| 9,343,132 B2 | 5/2016 | Lee et al. |
| 9,378,792 B2 | 6/2016 | Houssameddine |
| 9,589,622 B2 | 3/2017 | Schneider et al. |
| 2013/0208543 A1* | 8/2013 | Park .................... G11C 11/5628 365/185.19 |

* cited by examiner

MEMORY DEVICE AND PROGRAMMING METHOD

CROSS-REFERENCE TO RELATED APPLICATIONS

This application claims priority under 35 U.S.C. § 119 to Korean Patent Application No. 10-2018-0075896 filed on Jun. 29, 2018, in the Korean Intellectual Property Office, the disclosure of which is incorporated by reference herein in its entirety.

BACKGROUND

The inventive concept relates to semiconductor devices, and more particularly, relates to programming methods of magnetic memory devices.

The demand for nonvolatile semiconductor memory devices, which may be highly integrated and have large storage capacities, is increasing from with time. A representative example of a nonvolatile memory device is a flash memory, which is used in portable electronic devices. However, there active development in creating a nonvolatile element, which is randomly accessible and has improved performance. A representative example of such a nonvolatile element is a magnetic random access memory (MRAM) using a tunneling magneto-resistive (TMR) layer.

In general, a write error rate decreases in the case of increasing a write voltage upon performing a program operation on a MRAM. However, due to a manufacturing process issue, there is an increase in defective memory cells in which the write error rate does not decrease even though the write voltage is increased. With regard to defective memory cells, a decrease of the write error rate may be important to increase the quantity of memory devices manufactured (i.e., to increase the yield), as well as to improve the reliability of the memory devices.

SUMMARY

Embodiments of the inventive concept provide a program method for reducing a write error rate of a magnetic memory device.

According to an example embodiment, a memory device includes a memory cell array that includes a target cell, a row decoder that is configured to drive a word line connected to the target cell with a first driving voltage, in a first program operation and a second program operation, and a write driver and sense amplifier. Between a start of the first program operation and an end of the second program operation, the write driver and sense amplifier is configured to continuously drive a bit line connected to the target cell with a second driving voltage or drive a source line connected to the target cell with a third driving voltage.

According to an example embodiment, a method for programming a variable resistance memory cell includes maintaining a bit line voltage and a source line voltage continuously through first and second program operations on the variable resistance memory cell that are performed consecutively, but are separated in time.

According to an example embodiment, a memory device includes control logic that is configured to generate a row control signal and a column control signal based on a clock signal and a command, a divider that is configured to divide the clock signal, a memory cell array that includes a target cell, a row decoder that is configured to drive a word line connected to the target cell with a first driving voltage, based on the row control signal and the divided clock signal, in a first program operation and a second program operation, and a write driver and sense amplifier. In the first program operation and the second program operation, based on the column control signal and the divided clock signal, the write driver and sense amplifier is configured to drive a bit line connected to the target cell with a second driving voltage or drive a source line connected to the target cell with a third driving voltage.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
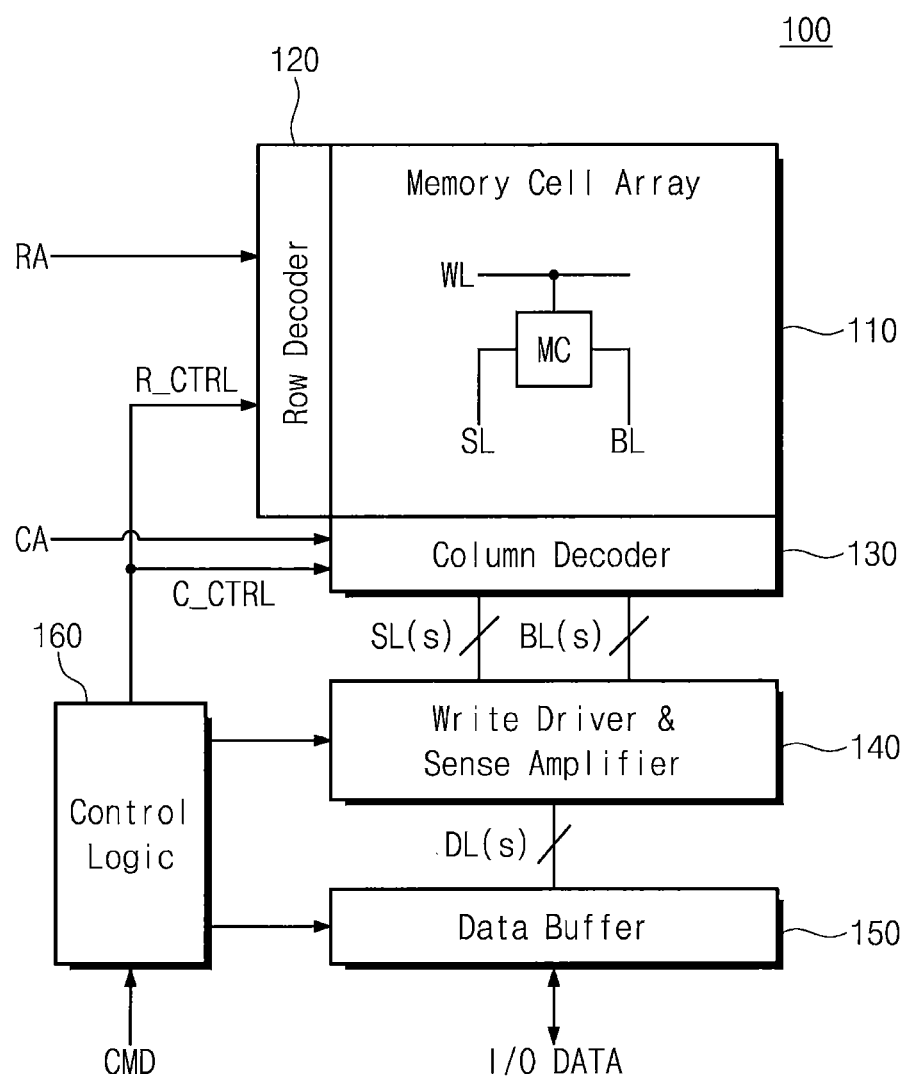
FIG. 1 is a diagram illustrating a configuration of a memory device according to an example embodiment of the inventive concept.

Various example embodiments will now be described more fully hereinafter with reference to the accompanying drawings. Like reference numerals may refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

In a program operation of a magnetic random access memory (MRAM) device, a write error rate (WER) decreases as a level of a program voltage increases. Increasing the program voltage level for reducing WER is effective only up to a threshold voltage level. Increasing the programming voltage above this threshold level provides relatively little improvement in WER. Some embodiments of the inventive concept stem from a realization that a memory device cell, such as an MRAM cell, for example, may be programmed using consecutive program operations where the bit line and/or the source line voltages are maintained continuously through the beginning of the first programming operation through the end of the second programming operation. This may allow the time normally used to ramp up the bit line and/or the source line voltages to levels suitable for programming the cell to be used for performing the programming operation thereby increasing the overall time devoted to programming the cell. Such increased programming time may reduce the WER and improve the reliability of the memory device.

FIG. 1 is a diagram illustrating a configuration of a memory device according to an example embodiment of the inventive concept. A memory device 100 includes a memory cell array 110, a row decoder 120, a column decoder 130, a write driver and sense amplifier 140, a data buffer 150, and control logic 160.

The memory cell array 110 may include a plurality of memory cells comprising variable resistance memory cells. For example, the memory cells of the memory cell array 110 may include spin transfer torque magneto resistive RAM (STT-MRAM) cells. In embodiments in which the memory cells are implemented using the STT-MRAM cell, each memory cell may include a magnetic tunnel junction (MTJ) element having a magnetic material.

The row decoder 120 may receive a row address RA and a row control signal R_CTRL and may decode the row address RA. The row decoder 120 may select and drive a word line WL connected to a memory cell MC on which a read operation or a write operation will be performed based on the row address RA and the row control signal R_CTRL. That is, the row decoder 120 may provide a driving voltage to the word line WL.

The column decoder 130 may receive a column address CA and a column control signal C_CTRL and may decode the column address CA. The column decoder 130 may select and drive a bit line BL and a source line SL connected to the memory cell MC on which the read operation or the write operation will be performed, based on the column address CA and the column control signal C_CTRL.

In the write operation, the write driver and sense amplifier 140 may provide write data to a memory cell selected by the row decoder 120 and the column decoder 130. The write driver and sense amplifier 140 may receive data from the data buffer 150 and may drive the bit line BL and/or the source line SL connected to the column decoder 130 based on the received data. That is, the write driver and sense amplifier 140 may provide a driving voltage to the bit line BL and/or the source line SL.

In the read operation, the write driver and sense amplifier 140 may sense data stored in the memory cell selected by the row decoder 120 and the column decoder 130. For example, the write driver and sense amplifier 140 may compare a voltage of the bit line BL connected to the selected memory cell and a voltage of a reference bit line (not illustrated) and may amplify a difference corresponding to a result of the comparison. The write driver and sense amplifier 140 may latch a voltage corresponding to the amplified difference and may determine one or more data values based thereon.

The data buffer 150 may store write data received from outside of the memory device 100 or read data read from the memory cell array 110. The data buffer 150 may include a deserializer (not illustrated) for deserializing the write data and a serializer (not illustrated) for serializing the read data.

The control logic 160 may decode a command received from outside of the memory device 100. For example, the control logic 160 may decode an activate command, a write command, a read command, a precharge command, etc. For example, the control logic 160 may generate the row control signal R_CTRL based on the activate command or the precharge command to control the row decoder 120. For example, the control logic 160 may generate the column control signal C_CTRL based on the write command or the read command to control the column decoder 130.

The memory device 100 according to an example embodiment of the inventive concept may perform the write operation by using at least two consecutive word line voltage pulses for the purpose of decreasing a write error rate WER. For example, the control logic 160 may control the row decoder 120 by using the row control signal R_CTRL, such that the row decoder 120 may drive a word line at least two times consecutively for a single write operation. The control logic 160 may control the column decoder 130 by using the column control signal C_CTRL, such that a voltage level of the bit line BL or the source line SL is maintained (or kept) constant from a start of a first program operation to an end of a second program operation.

In some embodiments of the above-described programming method, a "decrease of effective program time" due to a time required to charge the bit line BL during the second program operation may be reduced or prevented. That is, according to the programming method according to some embodiments of the inventive concept, the probability that an error occurs may markedly decrease by securing the "effective program time." The programming method according to some embodiments of the inventive concept will be more fully described in FIGS. 7-19.

Figure 2A:
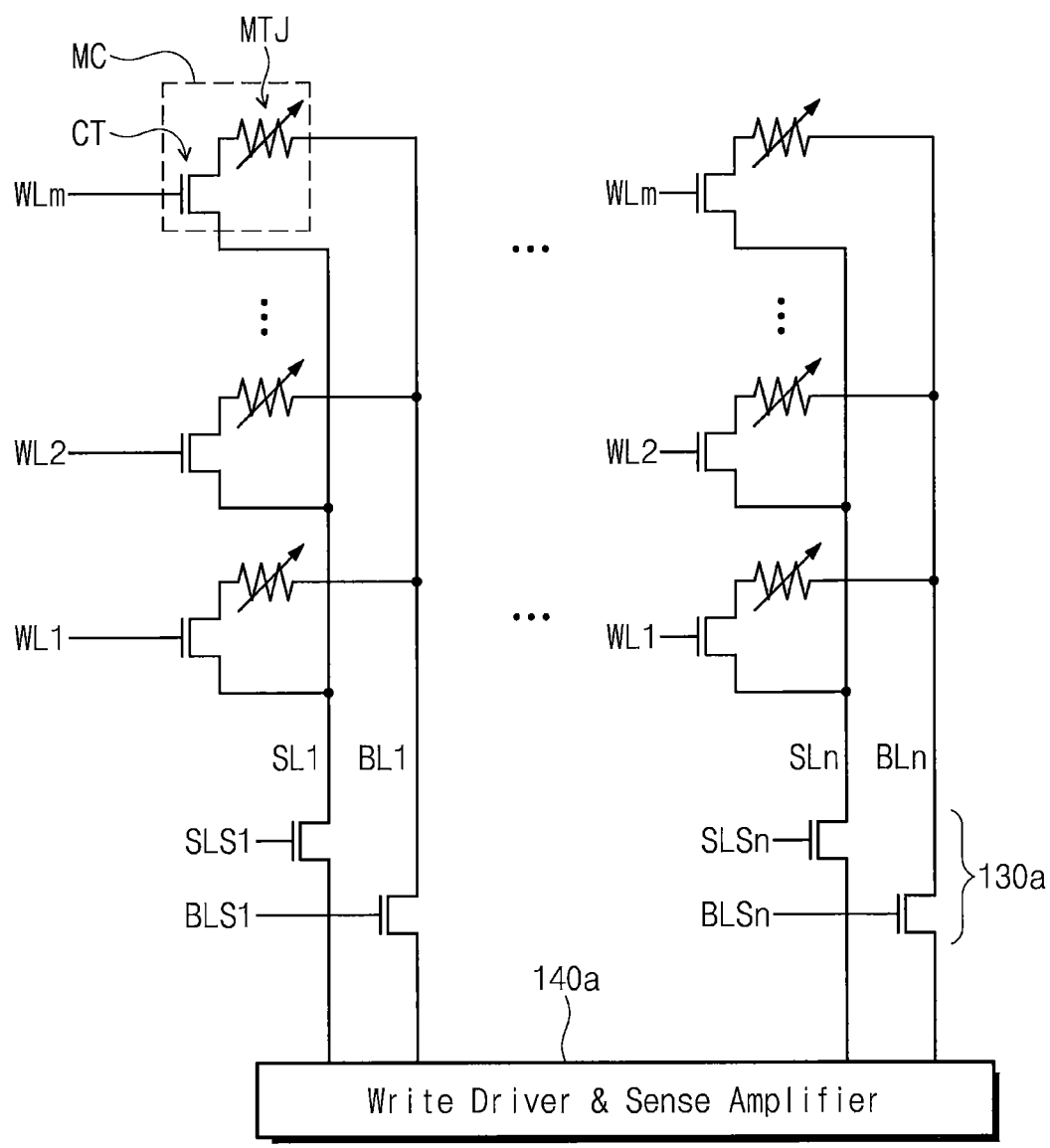
FIG. 2A is a diagram illustrating an embodiment of a memory cell array of FIG. 1.

FIG. 2A is a diagram illustrating an embodiment of the memory cell array 110 of FIG. 1. For better understanding, the column decoder 130 and the write driver and sense amplifier 140 of FIG. 1 are illustrated together.

A memory cell array 110a may include a plurality of memory cells MC arranged along a row direction and a column direction. Each memory cell MC may include a magnetic tunnel junction (MTJ) element and a cell transistor CT. A resistance value of a magnetic tunnel junction MTJ may vary with a magnitude and a direction of a current (or voltage) provided to the magnetic tunnel junction (MTJ) element. The resistance value may be maintained without change even though a current (or voltage) is not provided to the magnetic tunnel junction (MTJ) element. That is, the magnetic tunnel junction (MTJ) element may have a nonvolatile characteristic.

Gate electrodes of the cell transistors CT may be connected to word lines WL1 to WLn. Each cell transistor CT may be switched on or switched off by a signal provided through the corresponding word line. A drain electrode of each cell transistor CT may be connected to the magnetic tunnel junction (MTJ) element, and a source electrode thereof may be connected to the corresponding source line SL. For example, all the source electrodes of the cell transistors CT may be connected to the same source line. In other embodiments, only a portion of the source electrodes of the cell transistors CT may be connected to the same source line. In other embodiments, the source electrodes of the cell transistors CT may be connected to different source lines.

Source lines SL1 to SLn and bit lines BL1 to BLn may be connected to a write driver and sense amplifier 140a through a column decoder 130a. For example, in the example embodiment shown in FIG. 2A, the column decoder 130a includes a plurality of transistors controlled by source line selection signals SLS1 to SLSn and a plurality of transistors controlled by a plurality of bit line selection signals BLS1 to BLSn. However, embodiments of the configuration of the column decoder 130a are not limited thereto. For example, for a program operation, the column decoder 130a may comprise various logic elements for selectively switching on at least a portion of the source lines SL1 to SLn and the bit lines BL1 to BLn.

Figure 2B:
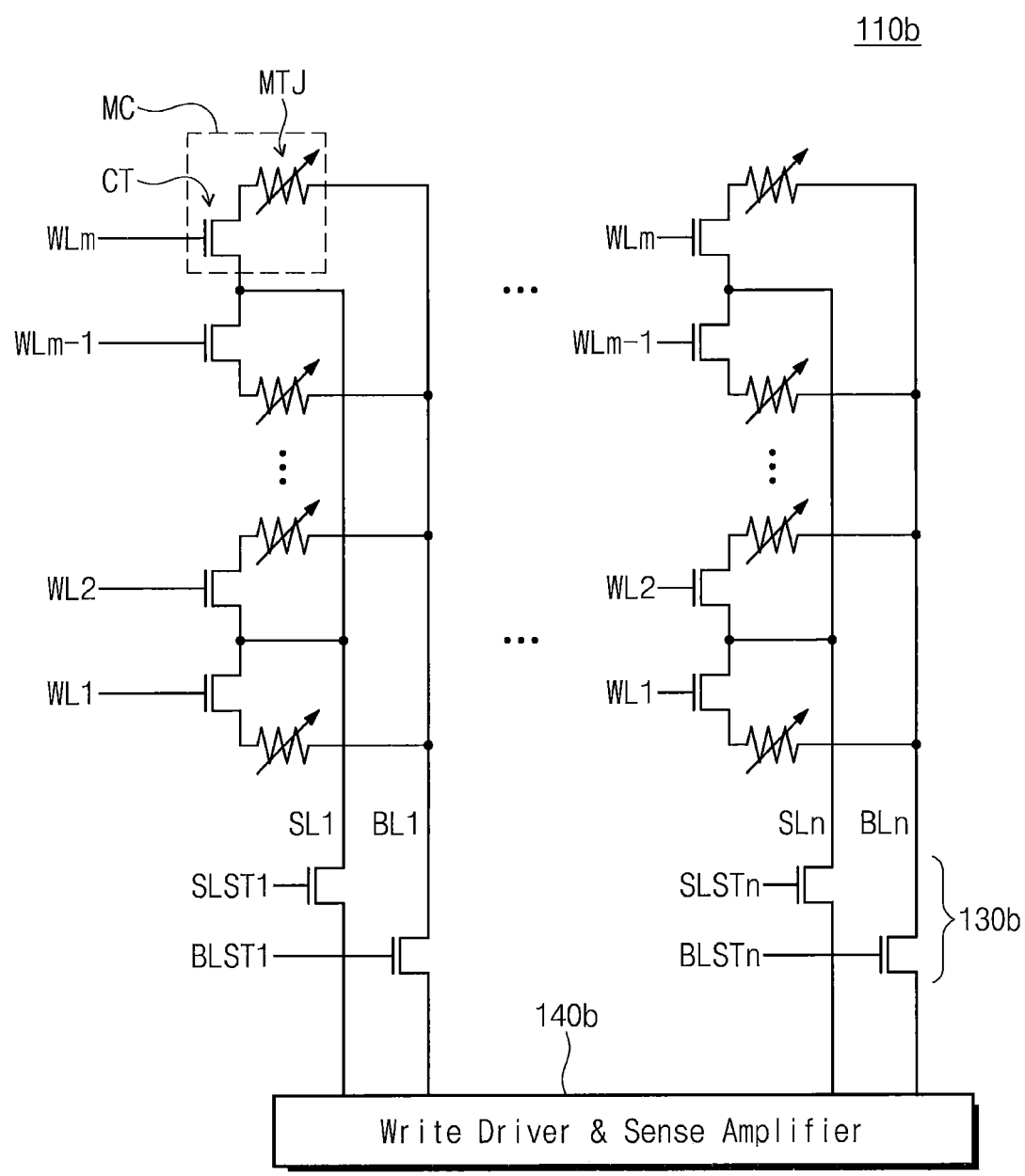
FIG. 2B is a diagram illustrating another embodiment of a memory cell array of FIG. 1.

FIG. 2B is a diagram illustrating another embodiment of the memory cell array 110 of FIG. 1. As illustrated in FIG. 2B, a memory cell array 110b may be configured in such a way that two different memory cells share one source line (e.g., SL1). In another embodiment, the memory cell array 110b may be configured in such a way that four different memory cells share one source line. The memory cell array 110b of FIG. 2B may be similar to the memory cell array 110a of FIG. 2A, except for a way in which source lines are connected. Thus, duplicated description will be omitted in the interest of clarity and brevity.

Figure 3:
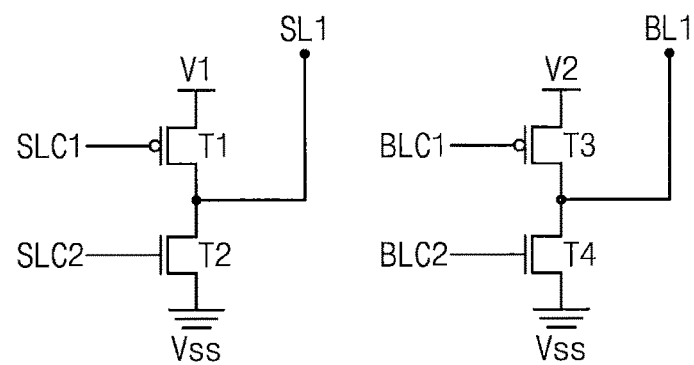
FIG. 3 is a diagram illustrating an example configuration of a write driver and sense amplifier of FIG. 1.

FIG. 3 is a diagram illustrating an example configuration of the write driver and sense amplifier 140 of FIG. 1. For brevity of illustration, a first source line SL1 of a plurality of source lines and a first bit line BL1 of a plurality of bit lines are illustrated.

The write driver and sense amplifier 140 may be configured to drive the first source line SL1 with a first voltage V1 and to drive the first bit line BL1 with a second voltage V2. The first voltage V1 and the second voltage V2 may be identical to or different from each other.

For example, in the case where logic "0" is programmed to a memory cell MC connected to the first source line SL1 and the first bit line BL1, a ground voltage Vss may be applied to the first source line SL1, and the second voltage V2 may be applied to the first bit line BL1. To this end, a first transistor T1 may be turned off by a first source line control signal SLC1, and a second transistor T2 may be turned on by a second source line control signal SLC2. In contrast, a third transistor T3 may be turned on by a first bit line control signal BLC1, and a fourth transistor T4 may be turned off by a second bit line control signal BLC2.

For example, in the case where logic "1" is programmed to the memory cell MC connected to the first source line SL1 and the first bit line BL1, the first voltage V1 may be applied to the first source line SL1, and the ground voltage Vss may be applied to the first bit line BL1. To this end, the first transistor T1 may be turned on by the first source line control signal SLC1, and the second transistor T2 may be turned off by the second source line control signal SLC2. In contrast, the third transistor T3 may be turned off by the first bit line control signal BLC1, and the fourth transistor T4 may be turned on by the second bit line control signal BLC2.

An example configuration of the write driver and sense amplifier 140 is described with reference to FIG. 3, and embodiments the inventive concepts are not limited thereto. For example, a methodology to maintain a voltage level of a bit line or a source line relatively constant while performing a program operation at least two times consecutively for the purpose of decreasing the write error rate WER may be similarly applied to various write driver and sense amplifier configurations in accordance with different embodiments of the inventive concepts.

Figure 4:
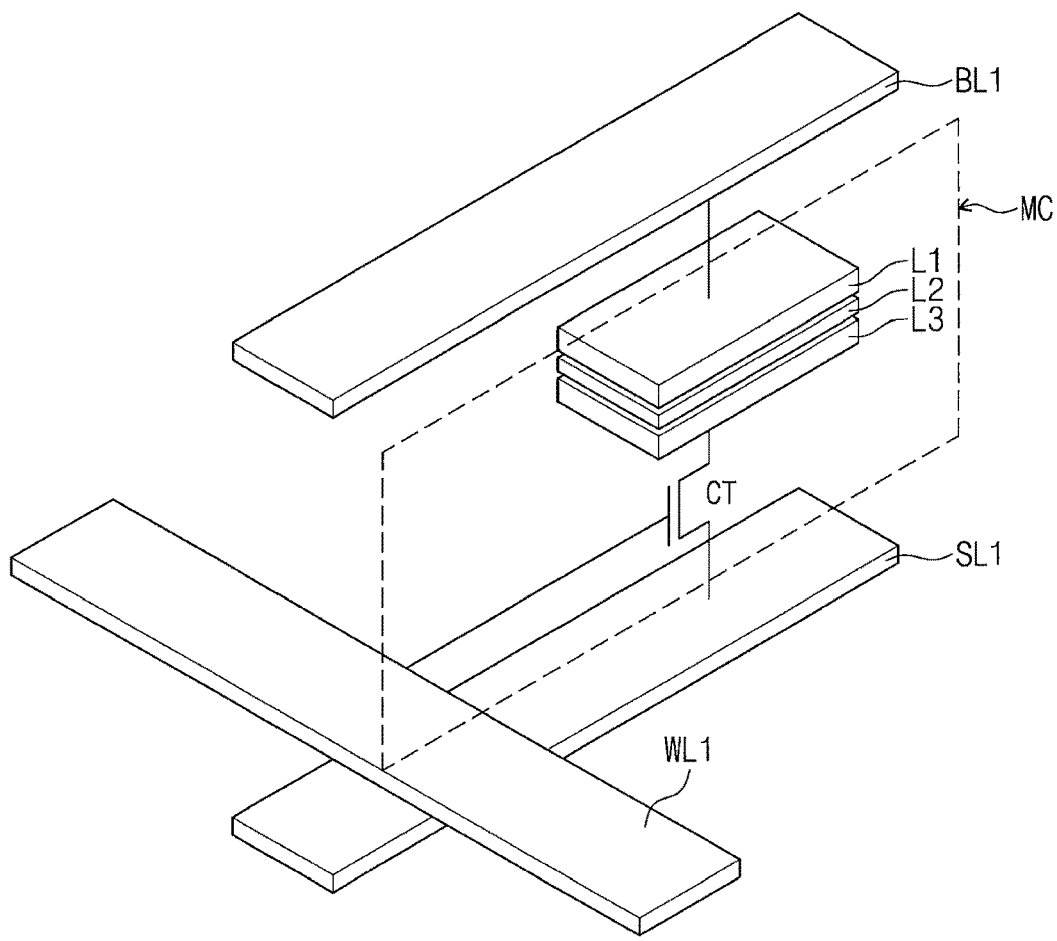
FIG. 4 is a diagram illustrating an example configuration of a memory cell included in a memory cell array of FIG. 1.

FIG. 4 is a diagram illustrating an example configuration of a memory cell included in the memory cell array 110 of FIG. 1. A memory cell MC may include a magnetic tunnel junction (MTJ) element L1 to L3 and a cell transistor CT.

A gate electrode of the cell transistor CT may be connected to a word line (e.g., the first word line WL1), and a first end of the cell transistor CT may be connected to a bit line (e.g., the first bit line BL1) through the magnetic tunnel junction element. A second end of the cell transistor CT may be connected to a source line (e.g., the first source line SL1).

The magnetic tunnel junction element may include a pinned layer L3, a free layer L1, and a barrier layer (or tunneling barrier layer) L2 provided between the layers L1 and L3. A magnetization direction of the pinned layer L3 may be pinned, and a magnetization direction of the free layer L1 may be identical or opposite to the magnetization direction of the pinned layer L3 based on a condition, such as the direction of write currents flowing through the MTJ element. To pin the magnetization direction of the pinned layer L3, for example, the memory cell MC may further include a layer for forming an anti-ferromagnetic layer (not illustrated) and/or a synthetic anti-ferromagnetic layer.

The free layer L1 may include a material, which has a variable magnetization direction. The magnetization direction of the free layer L1 may be changed by an electrical/magnetic factor provided from the outside and/or the inside of the memory cell MC. The free layer L1 may include a ferromagnetic material, which contains cobalt (Co), iron (Fe), and/or nickel (Ni). For example, the fixed layer L1 may include at least one material selected from a group of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

A thickness of the barrier layer L2 may be smaller than that of a spin diffusion distance. The barrier layer L2 may include a nonmagnetic material. For example, the barrier layer L2 may include magnesium (Mg), titanium (Ti), aluminum (Al), oxide of magnesium-zinc (MgZn) and magnesium-boron (MgB), and/or nitride of titanium (Ti) and vanadium (V).

The pinned layer L3 may have a magnetization direction pinned by the anti-ferromagnetic layer. Also, the pinned layer L3 may include a ferromagnetic material. For example, the pinned layer L3 may include at least one material selected from a group of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer (not illustrated) may include an anti-ferromagnetic material. For example, the anti-ferromagnetic layer may include at least one material selected from a group of PtMn, IrMn, MnO, MnS, MnTe, $MnF_2$, $FeCl_2$, FeO, $CoCl_2$, CoO, $NiCl_2$, NiO, and Cr.

The synthetic anti-ferromagnetic layer may include a spacer including at Cu, Ru, and/or Ir and a pinned layer having generally strong magnetic anisotropy. The pinned layer may include an alloy of a ferromagnetic material, such as Co, Ni, or for example, and an anti-ferromagnetic material, such as Pt, Pd, Cr, or Ir, or a multilayer.

In a read operation, a voltage corresponding to a logical high may be applied to the first word line WL1 connected to the memory cell MC, and, thus, the cell transistor CT of the memory cell MC may be turned on. To measure (or determine) a resistance value of the magnetic tunnel junction (MTJ) element, a read current may be provided between the first bit line BL1 and the first source line SL1. Data stored in the magnetic tunnel junction (MTJ) element may be determined based on the measured resistance value.

In a write operation, a voltage corresponding to a logical high may be applied to the first word line WL1 connected to the memory cell MC, and, thus, the cell transistor CT of the memory cell MC may be turned on. To change a resistance value of the magnetic tunnel junction (MTJ) element, a write current may be provided between the first bit line BL1 and the first source line SL1. The read and write operations associated with the memory cell MC will be more fully described with reference to FIGS. 5 and 6.

Figure 5:
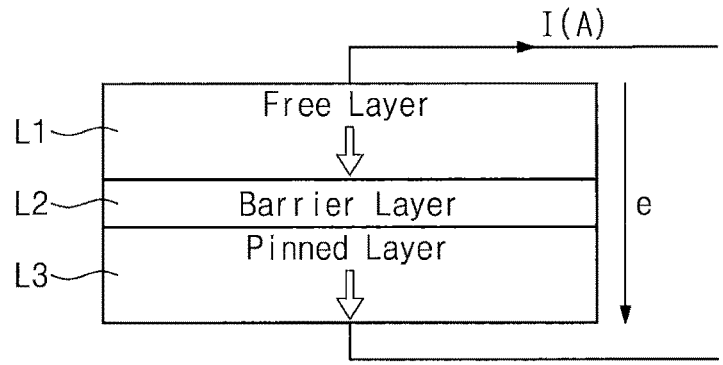
FIGS. 5 and 6 are diagrams illustrating a magnetization direction of a magnetic tunnel junction (MTJ) element, which is determined according to data stored in a memory cell of FIG. 4, according to an example embodiment of the inventive concept.
Figure 6:
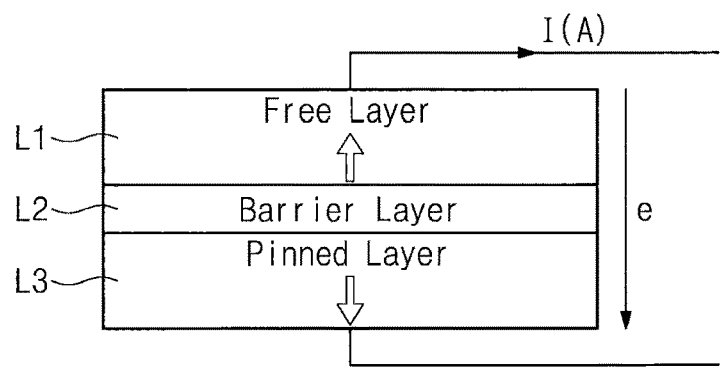

FIGS. 5 and 6 are diagrams illustrating a magnetization direction of a magnetic tunnel junction (MTJ) element determined according to data stored in a memory cell of FIG. 4 according to an example embodiment of the inventive concept.

A resistance value of an MTJ element may vary based on a magnetization direction of the free layer L1. If a current "I" is provided to the magnetic tunnel junction (MTJ) element, a data value corresponding to the resistance value of the magnetic tunnel junction (MTJ) element may be output. Because the intensity of the read current "I" may be much smaller than the intensity of a write current, in general, the magnetization direction of the free layer L1 may not change due to the read current "I".

Referring to FIG. 5, in the magnetic tunnel junction (MTJ) element, a magnetization direction of the free layer L1 and a magnetization direction of the pinned layer L3 are in parallel with each other, i.e., their magnetization directions are the same. Accordingly, the magnetic tunnel junction (MTJ) element may have a generally small resistance value. For example, the small resistance value of the MTJ element may correspond to a logical value of "0".

Referring to FIG. 6, in the magnetic tunnel junction (MTJ) element, the magnetization direction of the free layer L1 and the magnetization direction of the pinned layer L3 are anti-parallel, i.e., their magnetization directions oppose each other. Accordingly, the magnetic tunnel junction (MTJ) element may have a generally large resistance value. For example, the large resistance value of the MTJ element may correspond to a logical value of "1".

Figure 7:
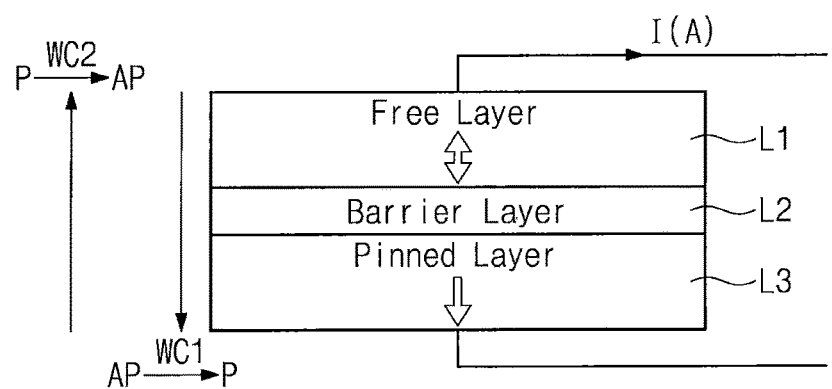
FIG. 7 is a diagram illustrating a write operation associated with a memory cell of FIG. 4 according to an example embodiment of the inventive concept.

FIG. 7 is a diagram for describing a write operation on a memory cell of FIG. 4. Referring to FIG. 7, a magnetization direction of the free layer L1 may be determined according to directions of write currents WC1 and WC2 flowing to the MTJ element. For example, if the first write current WC1 is provided, free electrons having the same spin direction as the pinned layer L3 provide torque to the free layer L1. As a result, the free layer L1 may be magnetized in parallel "P" with the pinned layer L3.

In contrast, if the second write current WC2 is provided, electrons having an opposite spin to the pinned layer L3 provide torque to the free layer L1. As a result, the free layer L1 may be magnetized in anti-parallel "AP" with the pinned layer L3. That is, in the magnetic tunnel junction (MTJ) element, the magnetization direction of the free layer L1 may be changed by spin transfer torque (STT).

Figure 8:
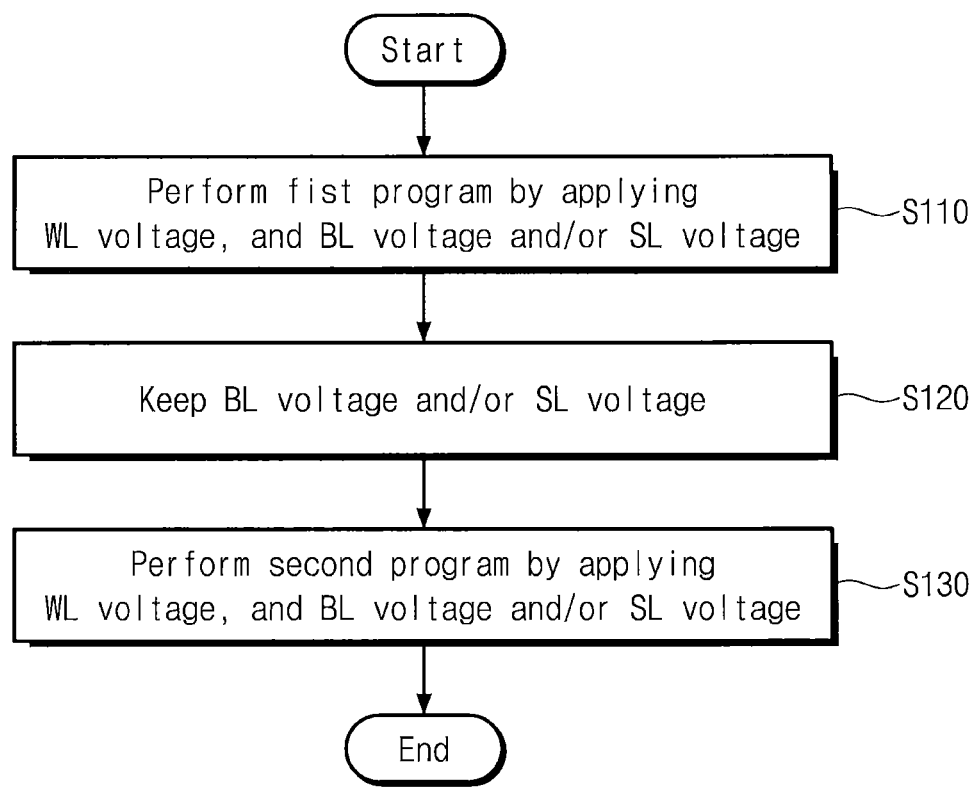
FIG. 8 is a flowchart illustrating a programming method according to an example embodiment of the inventive concept.

FIG. 8 is a flowchart illustrating a programming method according to an example embodiment of the present inventive concept. According to embodiments of the present inventive concept, a program operation may be performed at least two times consecutively for the purpose of decreasing a write error rate WER. For purposes of illustration, a description will be given with reference to FIGS. 1 to 7 together. Below, a program operation, which is first performed, is referred to as a "first program operation", and a program operation performed following the first program operation is referred to as a "second program operation".

In operation S110, the first program operation may be performed. For example, to program logic "0" to a memory cell, a word line voltage corresponding to logic "1" may be applied to a selected word line. Also, a bit line voltage corresponding to logic "1" may be applied to a bit line, and a source line voltage corresponding to logic "0" may be applied to a source line. In contrast, to program logic "1" to a memory cell, a word line voltage corresponding to logic "1" may be applied to a selected word line. Also, a bit line voltage corresponding to logic "0" may be applied to a bit line, and a source line voltage corresponding to logic "1" may be applied to a source line.

In operation S120, the bit line voltage and/or the source line voltage may be kept (or maintained). That is, in the case of programming logic "0", a bit line may be maintained at the bit line voltage corresponding to logic "1", and a source line may be maintained at the source line voltage corresponding to logic "0". In contrast, in the case of programming logic "1", a bit line may be maintained at the bit line voltage corresponding to logic "0", and a source line may be maintained at the source line voltage corresponding to logic "1".

In operation S130, the second program operation may be performed. The second program operation may be substantially identical to the first program operation. That is, because data to be programmed in the first program operation are reprogrammed, the word line voltage, the bit line voltage, and the source line voltage for the first program operation may be applied without change.

In an example embodiment of the present inventive concept, a reason for keeping the bit line voltage and/or the source line voltage the same or constant between the first program operation and the second program operation is as follows. In general, some time may be required to charge a bit line and/or a source line due to a parasitic capacitance component of the bit line and/or the source line itself. Unlike the embodiments of the present inventive concept, when a bit line and/or a source line is discharged during an idle period between the first program operation and the second program operation, in the second program operation, some time may be required to charge the bit line and/or the source line. This may decrease programming efficiency, thereby causing an increase of the write error rate WER.

Figure 9:
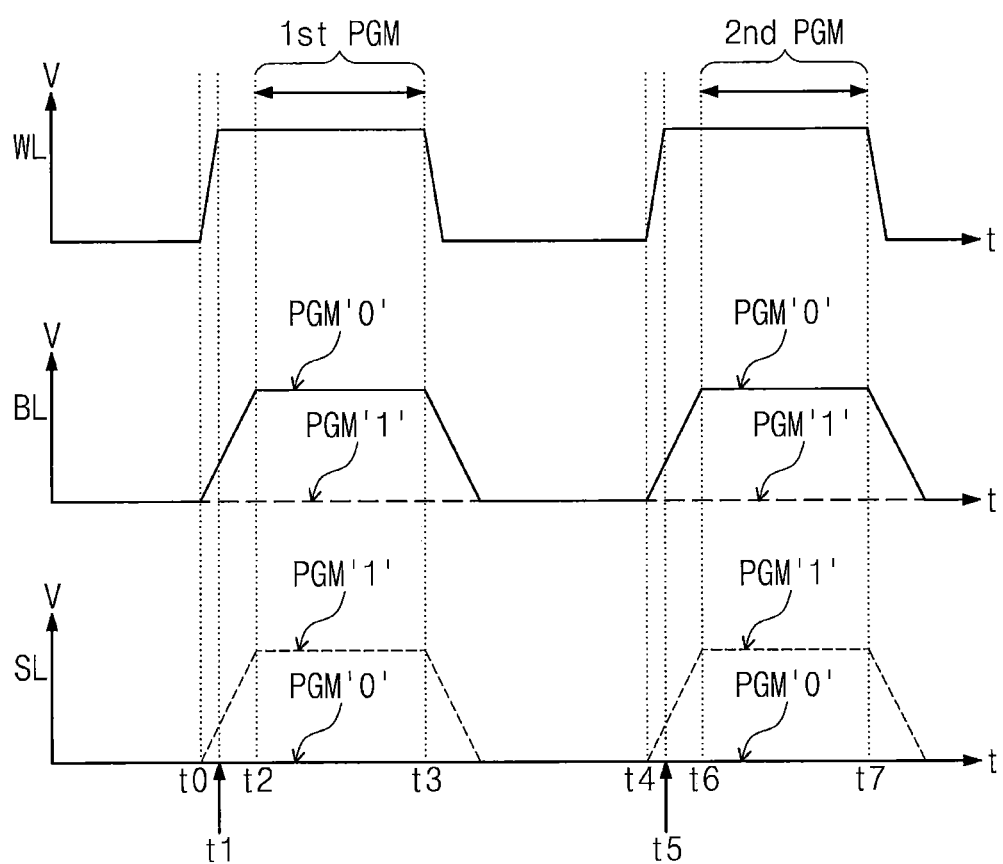
FIG. 9 is a timing diagram illustrating a programming method according to an example embodiment of the inventive concept.

FIG. 9 is a timing diagram illustrating a programming method according to an example embodiment of the present inventive concept. For purposes of illustration, a description will be given with reference to FIGS. 1 to 8 together. Three graphs illustrated in FIG. 9 indicate voltages of a word line, a bit line, and a source line, which are connected to a memory cell to be programmed, respectively.

The example where logic "0" is programmed to a target cell will be described with reference to graphs of FIG. 9 marked by a solid line.

As the word line connected to the target cell is driven at "t0", a word line voltage increases relatively slowly and reaches a target voltage level at "t1". A slope of the word line voltage may result from a parasitic capacitance component of a word line. For brevity of illustration, a voltage level of the word line is illustrated as increasing linearly between "t0" and "t1". A voltage level of the word line may increase similarly to an exponential function between "t0" and "t1".

At the same time, at "t0", a bit line to which the target cell is connected may be selected by the column decoder 130, and the write driver and sense amplifier 140 drives the bit line with the second voltage V2. However, a voltage level of the bit line may reach a target level at "t2". The reason is that a capacitance component of the bit line may be greater than a capacitance component of the word line.

Also, at "t0", a source line to which the target cell is connected may be selected by the column decoder 130, and the write driver and sense amplifier 140 provides a ground voltage to the source line.

At "t3", the first program operation may end. As illustrated in FIG. 9, the voltage level of the word line may decrease relatively sharply, and the voltage level of the bit line may decrease relatively slowly. For purposes of illustration, the voltage level of the word line and the voltage level of the bit line are illustrated as decreasing linearly. Actually, the voltage level of the word line and the voltage level of the bit line may decrease in the form of an exponential function.

The first program operation may be performed in a time interval in which the voltage level of the word line and the voltage level of the bit line correspond to logic "1". That is, because the voltage level of the bit line reaches a target level more slowly than the voltage level of the word line, the first program operation may be performed in a time interval between "t2" and "t3".

After the first program operation is completed, at "t4", the word line to which the target cell is connected may be driven, and, thus, the voltage level of the word line may increase slowly. The voltage level of the word line reaches a target voltage level at "t5". At "t4", the bit line to which the target cell is connected may be driven, and, thus, the voltage level of the bit line may increase relatively slowly. The voltage level of the bit line reaches a target voltage level at "t6". The source line may be maintained at a voltage level corresponding to logic "0".

Similar to in the first program operation, the second program operation may be performed in a time interval in which the voltage level of the word line and the voltage level of the bit line correspond to logic "1". That is, because the voltage level of the bit line reaches a target level more slowly than the voltage level of the word line, the second program operation may be performed in a time interval between "t6" and "t7".

Programming of logic "1" to the target cell is generally similar to programming of logic "0" to the target cell. In FIG. 9, graphs which are marked by a dotted line are associated with programming logic "1" to the target cell. However, in the first program operation and the second program operation, a voltage of the bit line is maintained at a voltage level corresponding to logic "0", and the source line is maintained at a voltage level corresponding to logic "1".

Figure 10:
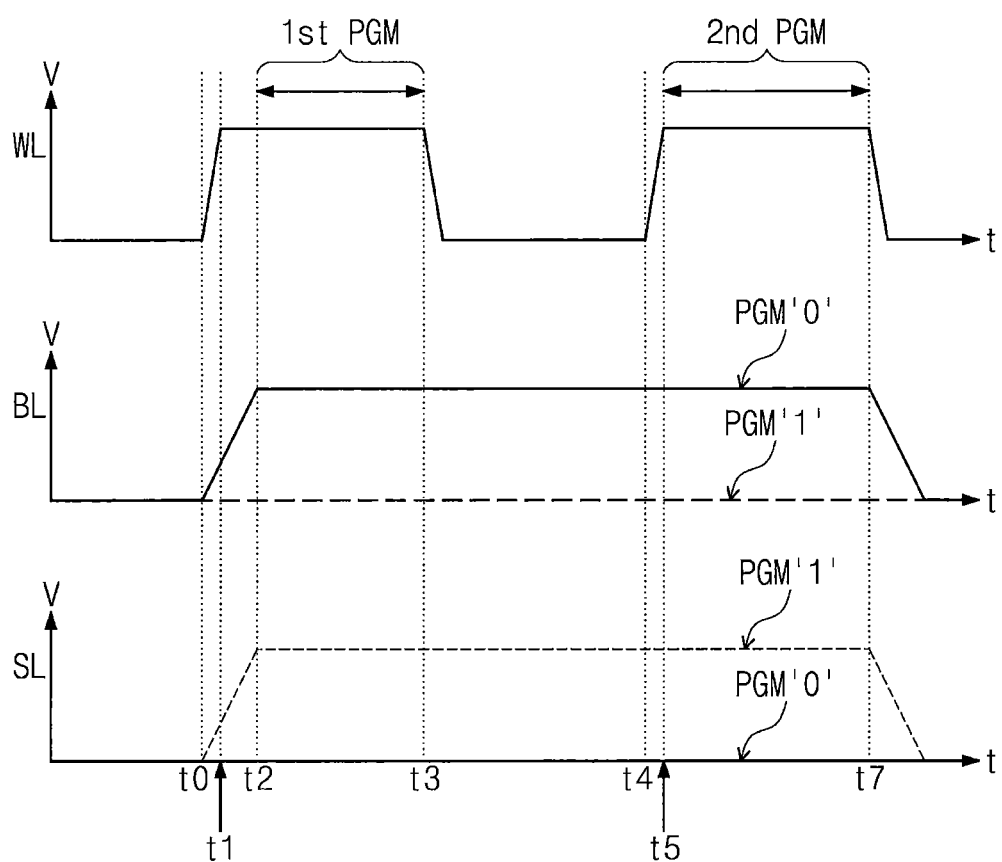
FIG. 10 is a timing diagram illustrating a programming method according to a further example embodiment of the inventive concept.

FIG. 10 is a timing diagram illustrating a programming method according to an example embodiment of the present inventive concept. For purposes of illustration, a description will be given with reference to FIGS. 1 to 8 together. Three graphs illustrated in FIG. 10 indicate voltages of a word line, a bit line, and a source line, which are connected to a memory cell to be programmed, respectively.

At "t0", a word line to which a target cell is connected may be driven, and, thus, a voltage level of the word line may increase relatively slowly. At "t1", a voltage of the word line reaches a target voltage level. A bit line to which the target cell is connected may be selected by the column decoder 130 at "t0", and the write driver and sense amplifier 140 drives the bit line with a voltage corresponding to logic "1". A voltage level of the bit line reaches a target voltage level at "t2". At "t0", a source line to which the target cell is connected may be selected by the column decoder 130, and the write driver and sense amplifier 140 provides a ground voltage to the source line.

At "t3", the voltage level of the word line starts to decrease. When the voltage level of the word line and the voltage level of the bit line are a voltage level corresponding to logic "1", the first program operation is performed. That is, the first program operation is performed in a time interval between "t2" and "t3".

Afterwards, even though the first program operation ends, a voltage level of the bit line may be maintained at a voltage level corresponding to logic "1" until a time point at which the voltage level of the word line starts to increase for the purpose of performing the second program operation. In contrast, the voltage level of the source line is maintained at the ground voltage.

At "t4", the word line to which the target cell is connected is driven, and, thus, the voltage level of the word line increases relatively slowly. At "t5", the voltage level of the word line reaches the target voltage level. Because the second program operation is performed in a time interval in which the voltage level of the word line and the voltage level of the bit line correspond to logic "1", the second program operation may be understood as being performed in a time interval between "t5" and "t7". The reason is that a sufficient time for charging a bit line is not required as the bit line is continuously maintained at a voltage level corresponding to logic "1". That is, in the present embodiment, a program time may be increased as much as (t6–t5) compared to the second program operation of FIG. 9. In other words, time used to charge the bit line for the second programming operation of FIG. 9 may be used to program the target memory cell in the embodiment of FIG. 10.

According to an example embodiment of the present inventive concept, as a program operation is performed at least two times consecutively, the write error rate WER may markedly decrease. In addition, as the voltage level of the bit line is maintained at a voltage level corresponding to logic "1", a portion of a time necessary to charge the bit line during the second programming operation may instead be used to program the target memory cell. As a result, the write error rate WER may further decrease.

Programming of logic "1" to the target cell is generally similar to programming of logic "0" to the target cell. In FIG. 10, graphs, which are marked by a dotted line, are associated with programming logic "1" to the target cell. However, in the first program operation and the second program operation, a voltage of the bit line is maintained at a voltage level corresponding to logic "0". The source line is maintained at a voltage level corresponding to logic "1" from a time point (i.e., t1) when the first program operation starts to a time point "t7" when the second program operation ends.

Figure 11:
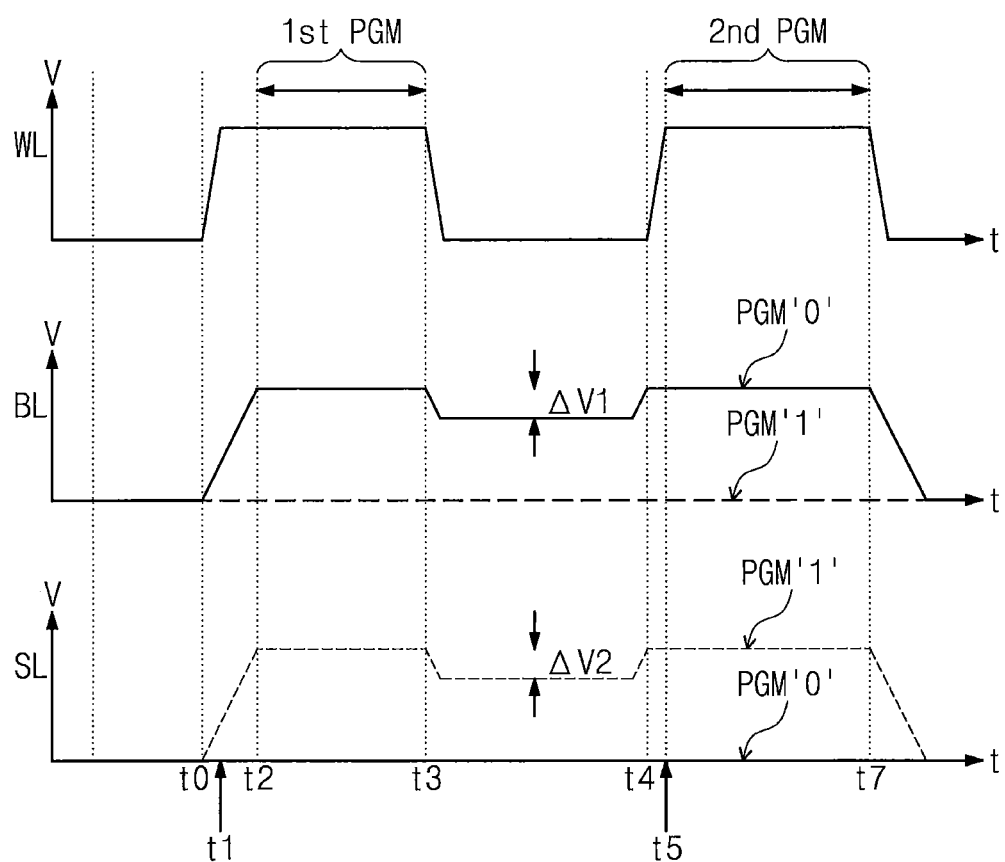
FIG. 11 is a timing diagram illustrating a programming method according to a further example embodiment of the inventive concept.

FIG. 11 is a timing diagram illustrating a programming method according to a further example embodiment of the present inventive concept. An embodiment of FIG. 11 is generally similar to the embodiment of FIG. 10. However, a voltage level of a bit line and/or a source line may change in a time interval (i.e., between t3 and t4) between the first program operation and the second program operation.

In the case of programming logic "0" to a target cell, in the time interval between the first program operation and the second program operation, the bit line may be maintained at a voltage level lower than a voltage level corresponding to logic "1," i.e., a high voltage level as contrasted with a ground or reference voltage, as much as ΔV1. The decrement ΔV1 may be determined within a range in which a magnetization characteristic of a memory cell does not change. The reason is that a magnetization characteristic should not change due to a decrease of a voltage level because logic "1" is already programmed in the first program operation.

In the case of programming logic "1" to a target cell, in the time interval between the first program operation and the second program operation, the source line may be maintained at a voltage level lower than a voltage level corresponding to logic "1," i.e., a high voltage level as contrasted with a ground or reference voltage, as much as ΔV2. Likewise, the decrement ΔV2 may be adjusted within a range in which a magnetization characteristic of a memory cell does not change. For example, the decrement ΔV1 may be identical to or different from the decrement ΔV2. For example, the decrements ΔV1 and ΔV2 may be determined by various factors such as a magnitude of a parasitic capacitance component of a bit line and a magnitude of a parasitic capacitance component of a source line.

As a voltage level of a bit line or a voltage level of a source line decreases within a given range in a time interval between the first program operation and the second program operation, power consumption of the memory device 100 may be reduced, in addition to a decrease of the write error rate WER of the memory device 100.

Figure 12:
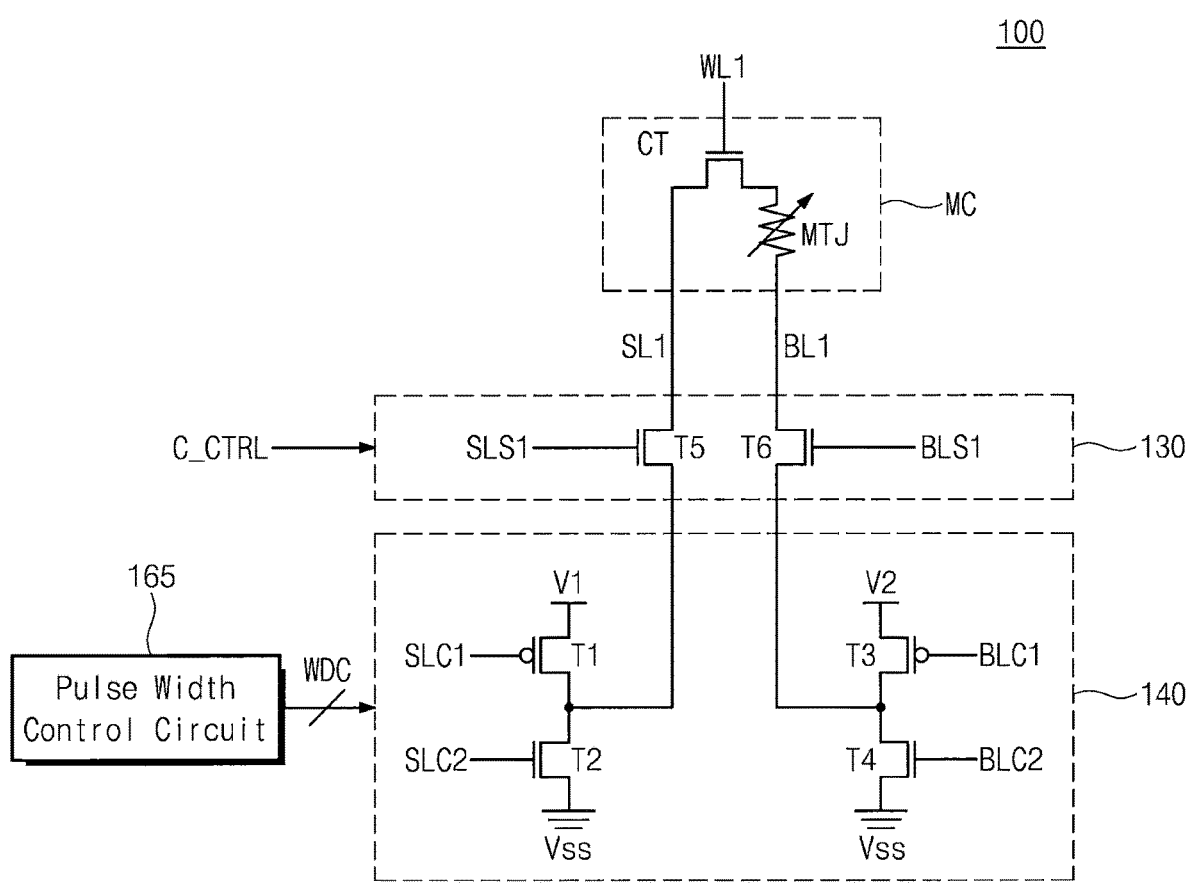
FIG. 12 is a diagram illustrating an example configuration of a memory device illustrated in FIG. 1.

FIG. 12 is a diagram illustrating an example configuration of the memory device 100 illustrated in FIG. 1 according to an example embodiment of the inventive concept. The memory device 100 may include a memory cell MC, the column decoder 130, the write driver and sense amplifier 140, and a pulse width control circuit 165. Configurations of the column decoder 130 and the write driver and sense amplifier 140 are illustrated by way of example, and operations of the column decoder 130 and the write driver and sense amplifier 140 are substantially similar to the operations described above. Thus, duplicated description will be omitted in the interest of brevity.

The pulse width control circuit 165 may be configured to control the write driver and sense amplifier 140. The pulse width control circuit 165 may operate based on various control signals received from the control logic 160 (refer to FIG. 1). For example, the pulse width control circuit 165 may be a separate circuit, which is implemented within the control logic 160. In other embodiments, the pulse width control circuit 165 may be a separate circuit, which is implemented within the write driver and sense amplifier 140. In still other embodiments, the pulse width control circuit 165 may be a separate circuit which is independent of the control logic 160 and the write driver and sense amplifier 140.

In some embodiments, the pulse width control circuit 165 is configured to control the write driver and sense amplifier 140 and will be described below. The pulse width control circuit 165 may generate write driver control signals WDC. The write driver control signals WDC may be used to control transistors of the write driver and sense amplifier 140. For example, the write driver control signals WDC may include the first bit line control signal BLC1, the second bit line control signal BLC2, the first source line control signal SLC1, and the second source line control signal SLC2.

In the case of programming logic "1" or logic "0" to the memory cell MC, transistors T6 and T5 connected to the first bit line BL1 and the first source line SL1 are turned on. Such voltage levels as illustrated in FIGS. 10 and 11 may be maintained by selectively switching the transistors T1 to T4 of the write driver and sense amplifier 140. This will be described with reference to FIGS. 13 and 14.

Figure 13:
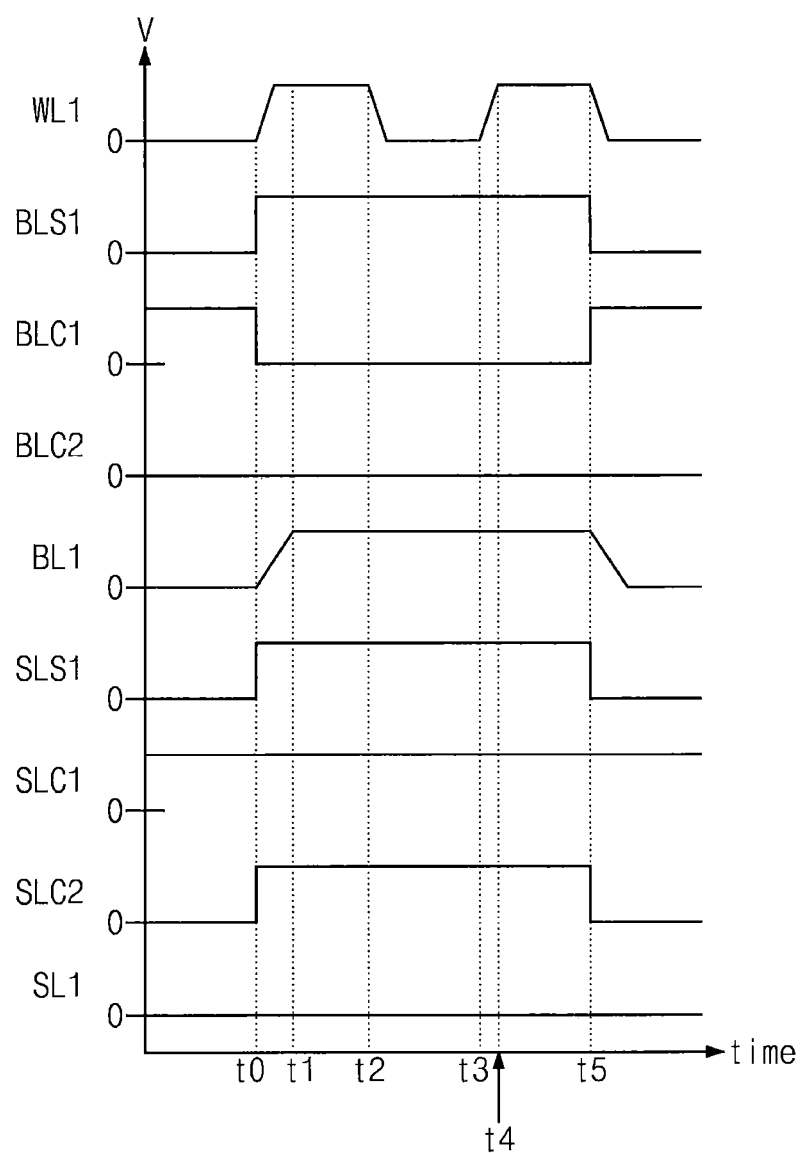
FIG. 13 is a timing diagram illustrating an example program operation of a memory device illustrated in FIG. 12.

FIG. 13 is a timing diagram illustrating a program operation of the memory device 100 illustrated in FIG. 12 according to an example embodiment of the inventive concept. In detail, FIG. 13 shows the first bit line selection signal BLS1 and the first source line selection signal SLS1 for controlling the column decoder 130, and the bit line control signals BLC1 and BLC2 and the source line control signals SLC1 and SLC2 for controlling the write driver and sense amplifier 140. In addition, FIG. 13 further shows voltage levels of the first bit line BL1 and the first source line SL1, which are determined according to the selection signals and control signals. Waveforms associated with an operation of programming logic "0" are illustrated in FIG. 13. For purposes of illustration, a description will be given with reference to FIGS. 12 and 13 together.

At "t0", the first bit line BL1 and the first source line SL1 may be selected. For example, the transistors T5 and T6 of the column decoder 130 may be respectively switched on by the first source line selection signal SLS1 and the first bit line selection signal BLS1.

At "t0", the first bit line control signal BLC1 for turning on the third transistor T3 is input to the third transistor T3. As such, the second voltage V2 may be provided to the first bit line BL1, and a voltage level of the first bit line BL1 may increase relatively slowly. Afterwards, at "t1", a voltage of the first bit line BL1 may reach a target level. For example, the voltage level of the first bit line BL1 may be maintained until a time point (i.e., t5) when the second program operation ends.

At "t0", the second source line control signal SLC2 for turning on the second transistor T2 is input to the second transistor T2, and thus, the ground voltage Vss is provided to the first source line SL1. As a result, the ground voltage Vss is provided to the first source line SL1. The voltage level of the first source line SL1 may be maintained at the ground voltage Vss from a start of the first program operation to an end of the second program operation.

To perform the first program operation on the memory cell MC, at "t0", a first word line WL1 is driven starting at "t0". The first program operation may be performed in a time interval (i.e., between t1 and t2) in which the voltage level of the first word line WL1 and the voltage level of the first bit line BL1 are a voltage level corresponding to logic "1," i.e., a high voltage level in contrast with a ground voltage level. Afterwards, under control of the row decoder 120

(refer to FIG. 1), the voltage level of the first word line WL1 decreases from a time point (i.e., t2) when the first program operation ends.

To perform the second program operation on the memory cell MC, at "t3", the first word line WL1 is driven starting at "t3". The second program operation may be performed in a time interval (i.e., between t4 and t5) in which the voltage level of the first word line WL1 and the voltage level of the first bit line BL1 are a voltage level corresponding to logic "1," i.e., a high voltage level in contrast with a ground voltage level. Afterwards, under control of the row decoder 120 (refer to FIG. 1), the voltage level of the first word line WL1 decreases from a time point (i.e., t5) when the second program operation ends.

Figure 14:
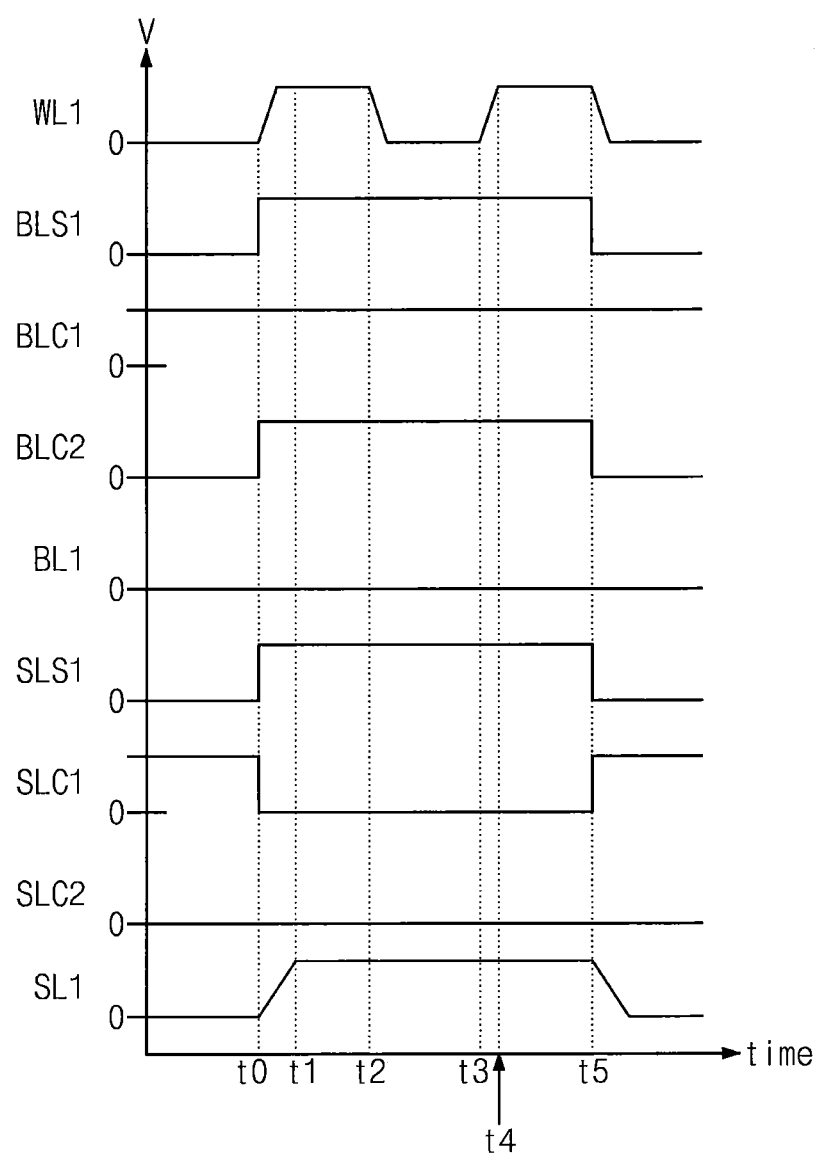
FIG. 14 is a timing diagram illustrating an example operation of a memory device illustrated in FIG. 12.

FIG. 14 is a timing diagram illustrating operation of the memory controller 100 illustrated in FIG. 12 according to an example embodiment of the inventive concept. In detail, FIG. 14 shows the first bit line selection signal BLS1 and the first source line selection signal SLS1 for controlling the column decoder 130, and the bit line control signals BLC1 and BLC2 and the source line control signals SLC1 and SLC2 for controlling the write driver and sense amplifier 140. In addition, FIG. 14 further shows voltage levels of the first bit line BL1 and the first source line SL1, which are determined according to selection signals and control signals. Waveforms associated with an operation of programming logic "1" are illustrated in FIG. 14. For better understanding, a description will be given with reference to FIG. 12 together.

At "t0", the first bit line BL1 and the first source line SL1 may be selected. For example, the transistors T5 and T6 of the column decoder 130 may be respectively switched on by the first source line selection signal SLS1 and the first bit line selection signal BLS1.

At "t0", the second bit line control signal BLC2 for turning on the fourth transistor T4 is input to the fourth transistor T4. As a result, the ground voltage Vss is provided to the first bit line BL1. The voltage level of the first source line SL1 may be maintained at the first voltage V1 from a start of the first program operation to an end of the second program operation.

At "t0", the first source line control signal SLC1 for turning on the first transistor T1 is input to the first transistor T1. As such, the first voltage V1 may be provided to the first source line SL1, and a voltage level of the first source line SL1 may increase relatively slowly. Afterwards, at "t1", a voltage of the first source line SL1 may reach a target level. For example, the voltage level of the first source line SL1 may be maintained until a time point (i.e., t5) when the second program operation ends.

Afterwards, to perform the first program operation and the second program operation, the first word line WL1 may be driven in a substantially similar manner to that described with reference to FIG. 13. Thus, duplicated description will be omitted in the interest of brevity.

Waveforms of the selection signals BLS1 and SLS1 and the control signals BLC1, BLC2, SLC1, and SLC2 illustrated in FIGS. 13 and 14 are an example. That is, to generate the waveforms of the first word line WL1, the first bit line BL1, and the first source line SL1 illustrated in FIGS. 13 and 14, the selection signals BLS1 and SLS1 and the control signals BLC1, BLC2, SLC1, and SLC2 may be driven at various levels, at various times and in various combinations.

Figure 15:
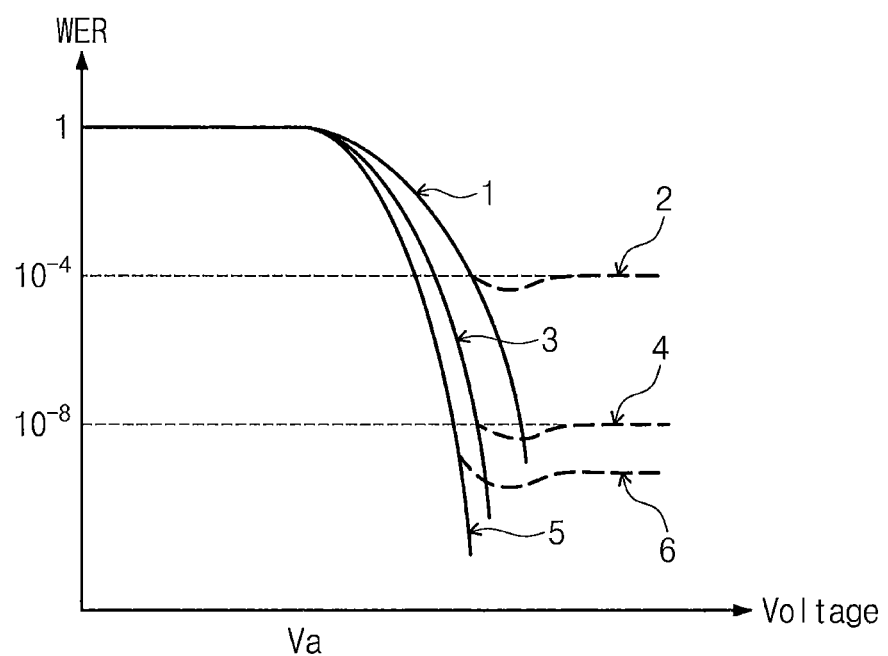
FIG. 15 is a graph illustrating a write error rate associated with a write voltage, according to embodiments of the inventive concept.

FIG. 15 is a graph illustrating a write error rate WER associated with a write voltage, according to embodiments of the inventive concept. A horizontal axis represents a write voltage (i.e., a bit line voltage or a source line voltage), and a vertical axis represents the write error rate WER of a log scale. For purposes of illustration, a description will be given with reference to FIGS. 9 and 10 together.

A graph identified by No. 1 indicates a write error rate when a program operation is performed on a normal cell only once. A graph identified by No. 2 indicates a write error rate when a program operation is performed on a defective cell only once. From the graph identified by No. 1, it may be understood that a write error rate decreases as a write voltage increases. However, it is observed that a write error rate converges in the vicinity of a particular value (e.g., $10^{-4}$) no matter how much a write voltage may increase upon performing a program operation on a defective cell.

A graph identified by No. 3 indicates a write error rate when performing a program operation on a normal cell based on the timing diagrams illustrated in FIG. 9. A graph identified by No. 4 indicates a write error rate when performing a program operation on a defective cell based on the timing diagrams illustrated in FIG. 9. As illustrated in FIG. 15, it is observed that a write error rate decreases markedly (in detail, the square of $10^{-4}$) in the case of performing program operations by using two consecutive pulses. That is, even though a program operation is performed on a defective cell, a write error rate converges in the vicinity of a particular value (e.g., $10^{-8}$).

A graph identified by No. 5 indicates a write error rate when performing a program operation on a normal cell based on the timing diagrams illustrated in FIG. 10. A graph identified by No. 6 indicates a write error rate when performing a program operation on a defective cell based on the timing diagrams illustrated in FIG. 10.

It is observed that a write error rate corresponding to the graph identified by No. 5 is lower than a write error rate corresponding to the graph identified by No. 3. The reason is that a portion of a time necessary to charge a bit line may instead be used as a program time in the second program operation. In detail, a time interval of (t6−t5) of the second program operation based on the timing diagrams illustrated in FIG. 9 may be used as additional programming time of the second program operation based on the timing diagrams illustrated in FIG. 10.

Also, it is observed that a write error rate corresponding to the graph identified by No. 6 is lower than a write error rate corresponding to the graph identified by No. 4. That is, even though a program operation is performed on a defective cell, a write error rate may further decrease, thereby improving the reliability of the memory device 100. As an indirect effect, it may be regarded as the yield is improved in the process of manufacturing the memory device 100.

Figure 16:
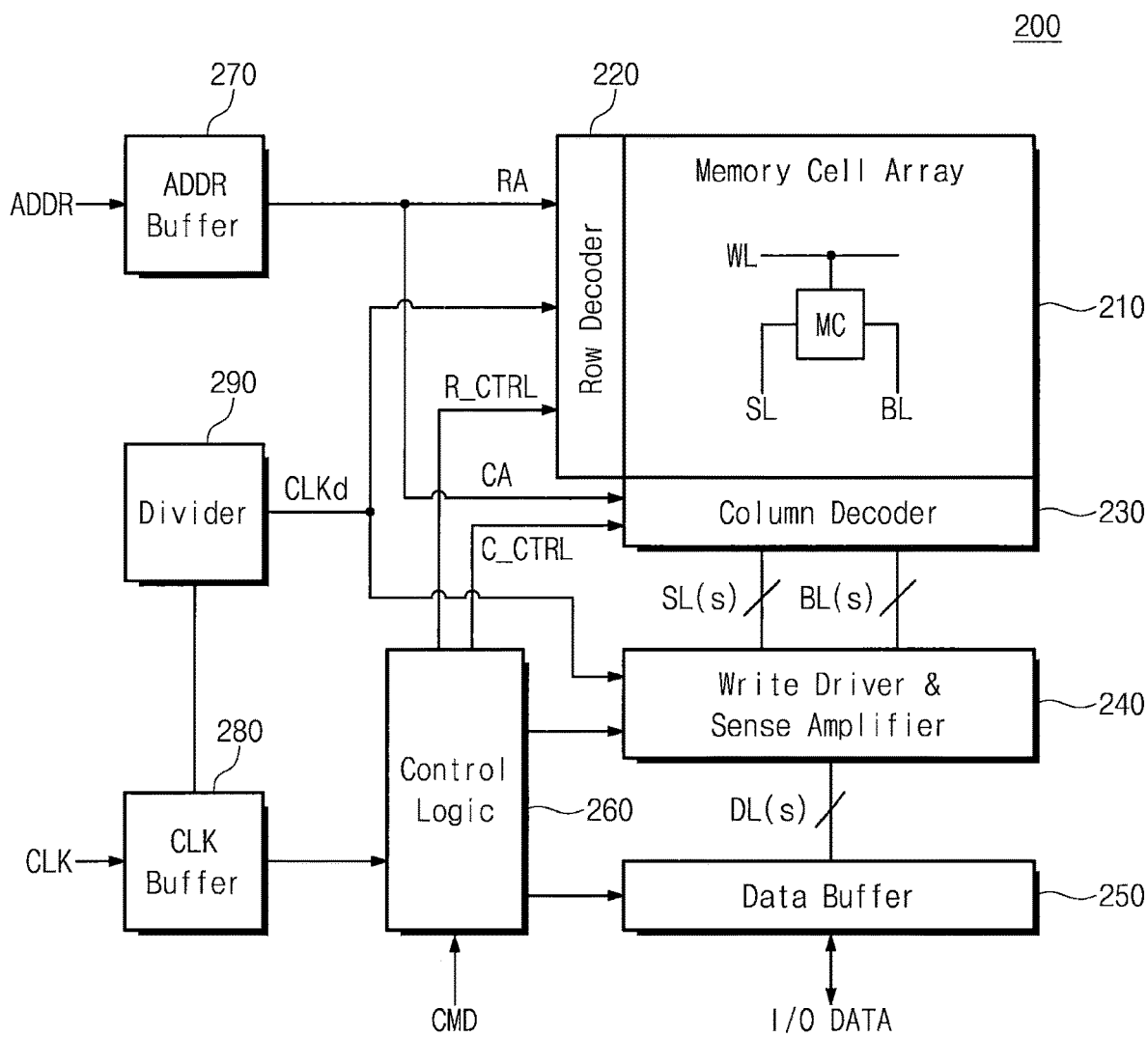
FIG. 16 is a diagram illustrating an example configuration of a memory device according to an embodiment of the inventive concept.

FIG. 16 is a diagram illustrating an example configuration of a memory device according to an embodiment of the present inventive concept. A memory device 200 includes a memory cell array 210, a row decoder 220, a column decoder 230, a write driver and sense amplifier 240, a data buffer 250, control logic 260, an address buffer 270, a clock buffer 280, and a divider 290. Components illustrated in FIG. 16 have substantially the same configuration and/or function as components of FIG. 1 having similar reference numerals. Thus, duplicated description will be omitted in the interest of brevity.

The memory device 200 operates based on a clock signal CLK and a command signal CMD received from outside of the memory device 200. However, the memory device 200 may generate a clock signal CLKd by dividing the clock signal CLK and may control pulses (or voltages) for a program operation, based on the clock signal CLKd. Such example operations will be described in detail with reference to FIGS. 18 and 19.

The address buffer 270 may receive and store (or buffer) an address ADDR from the outside of the memory device 200. In addition, the address buffer 270 may receive and store a bank address and a row address RA associated with an activate command, a column address CA associated with a write command or a read command, a bank address associated with a precharge command, an OP code for setting mode registers, etc. The address buffer 270 may provide the row address RA to the row decoder 220 and may provide the column address CA to the column decoder 230.

The clock buffer 280 may receive and buffer the clock signal CLK from the outside of the memory device 200. For example, the clock signal CLK may be used by the control logic 260 to generate the column control signal C_CTRL and the row control signal R_CTRL.

The divider 290 may receive the clock signal CLK from the clock buffer 280 and may generate the divided clock signal CLKd. That is, a frequency of the clock signal CLKd may be higher than a frequency of the clock signal CLK. The divider 290 may be implemented with various logic elements. The clock signal CLKd may be provided to the row decoder 220 and the write driver and sense amplifier 240.

Figure 17:
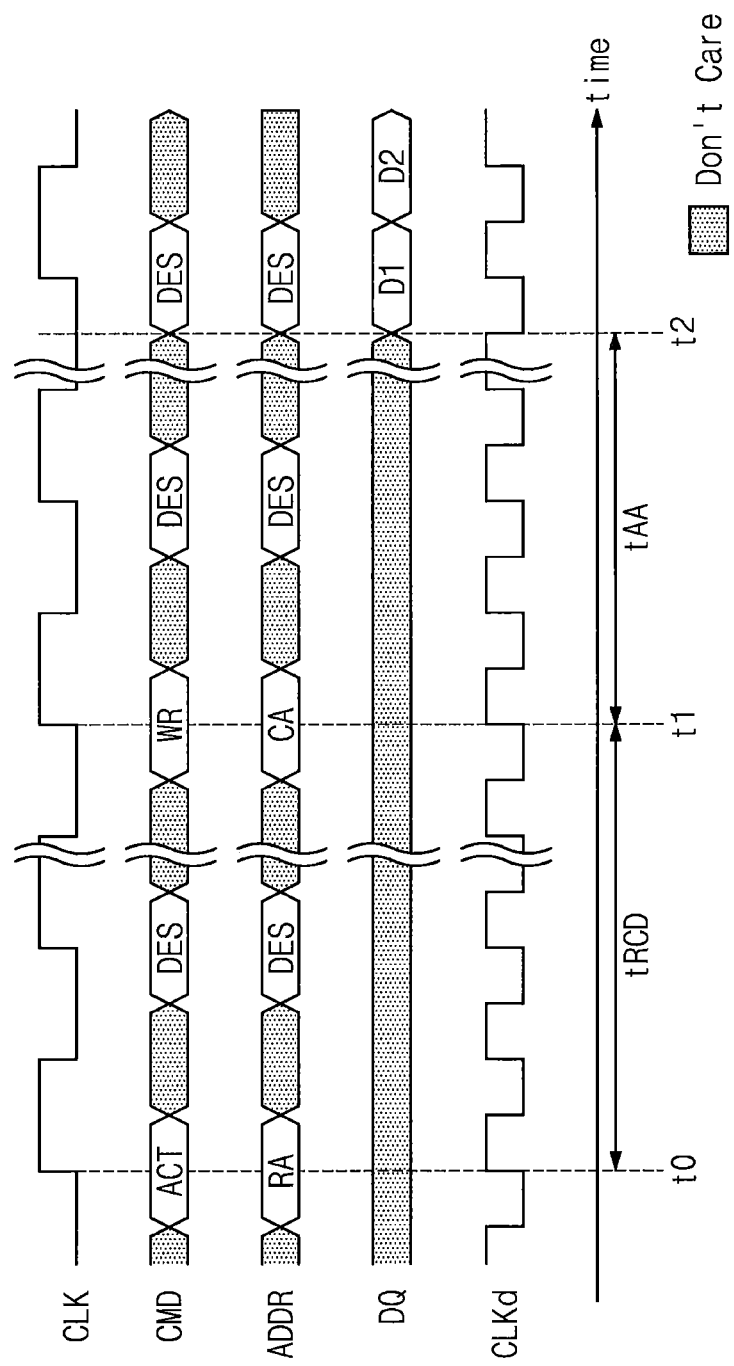
FIG. 17 is a timing diagram associated with an example program operation of a memory device of FIG. 16.

FIG. 17 is a timing diagram associated with a program operation of the memory device 200 of FIG. 16 according to an example embodiment of the inventive concept. For purposes of illustration, a description will be given with reference to FIGS. 16 and 17 together. In an embodiment, the timing diagram of FIG. 17 is based on the double data rate (DDR) interface standard, but embodiments of the inventive concept are not limited thereto.

When a write request is received from a host (not illustrated), a word line WL is selected by the row decoder 220 to which the row address RA is provided. An activation signal ACT is provided to the selected word line WL. Afterwards, at "t1" when a reference time (e.g., tRCD) elapses, the column address CA and a write command WR are provided to the column decoder 230. At "t2" when tAA passes from "t1", write data D1, D2, etc. are provided to the write driver and sense amplifier 240.

Figure 18:
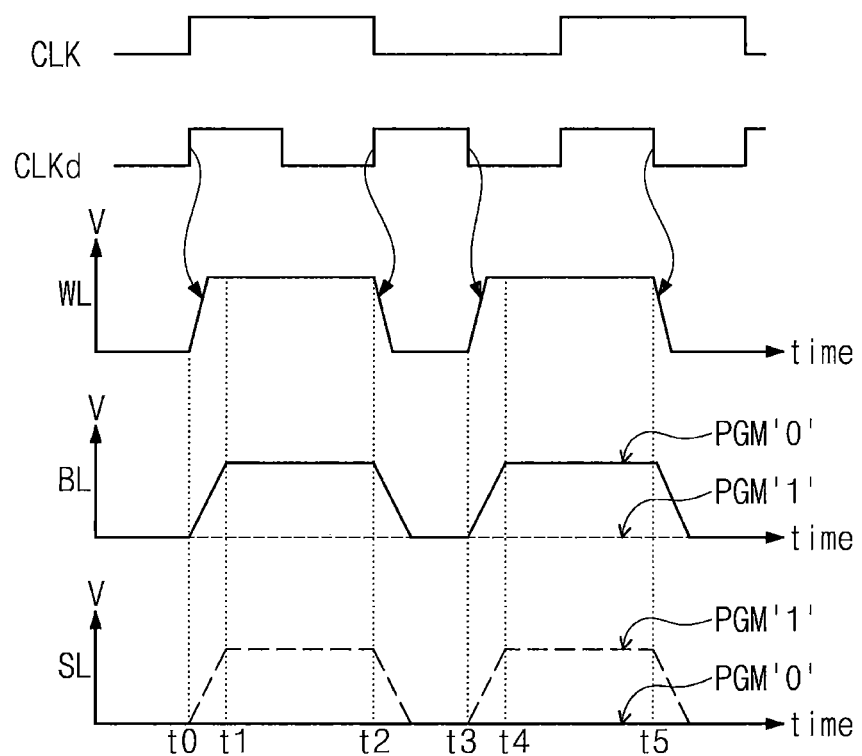
FIG. 18 is a diagram illustrating a programming method according to an example embodiment of the inventive concept.

FIG. 18 is a diagram illustrating a programming method according to an example embodiment of the inventive concept. In detail, FIG. 18 shows how to use the clock signal CLKd to drive a word line WL, a bit line BL, and a source line SL. The example where logic "0" is programmed to a target cell will be described with reference to FIGS. 16 and 18 in which the timing diagram of FIG. 18 is marked by a solid line.

The column decoder 230 starts to drive the word line WL at a rising edge (i.e., t0) of a first pulse of the clock signal CLKd. Due to a parasitic capacitance component of the word line WL, a voltage level of the word line WL may increase slowly. The column decoder 230 stops driving the word line WL at a rising edge (i.e., t2) of a second pulse of the clock signal CLKd.

The write driver and sense amplifier 240 starts to drive the bit line BL at the rising edge (i.e., t0) of the first pulse of the clock signal CLKd. That is, the write driver and sense amplifier 240 applies a voltage (e.g., V2 of FIG. 12) to the bit line BL. The write driver and sense amplifier 240 applies a ground voltage (e.g., Vss of FIG. 12) to the source line SL. The write driver and sense amplifier 240 stops driving the bit line BL at the rising edge (i.e., t2) of the second pulse of the clock signal CLKd.

The first program operation may be performed in a time interval (i.e., between t1 and t2) in which a voltage of the word line WL and a voltage of the bit line BL correspond to logic "1," i.e., a high voltage level in contrast with a ground voltage level. After the first program operation is completed at "t2", the voltage of the word line WL and the voltage of the bit line BL converge on a voltage corresponding to logic "0," i.e., a ground voltage level in contrast with a high voltage level.

The column decoder 230 starts to drive the word line WL at a falling edge (i.e., t3) of the second pulse of the clock signal CLKd, and stops driving the word line WL at a falling edge (i.e., t5) of a third pulse of the clock signal CLKd. The write driver and sense amplifier 240 starts to drive the bit line BL at the falling edge (i.e., t3) of the second pulse of the clock signal CLKd, and stops driving the bit line BL at the falling edge (i.e., t5) of the third pulse of the clock signal CLKd.

The second program operation may be performed in a time interval (i.e., between t4 and t5) in which a voltage of the word line WL and a voltage of the bit line BL correspond to logic "1," i.e., a high voltage level in contrast with a ground voltage level. After the second program operation is completed at "t5", the voltage of the word line WL and the voltage of the bit line BL converge on a voltage corresponding to logic "0," i.e., a ground voltage level in contrast with a high voltage level.

The embodiment of FIG. 18 is similar to the embodiment of FIG. 9. However, a time interval in which the first program operation is performed and a time interval in which the second program operation is performed are longer than time intervals described with reference to FIG. 9. Even though a voltage of the bit line BL is not maintained at a voltage corresponding to logic "1" in a time interval from an end of the first program operation to a start of the second program operation, a program time may increase through the above-described clock division scheme.

In an embodiment, the row decoder 220 may include a first pulse width control circuit (not illustrated) for generating a word line (WL) voltage of FIG. 18 by using the clock CLKd. Also, the write driver and sense amplifier 240 may include a second pulse width control circuit (not illustrated) for generating a bit line (BL) voltage and a source line (SL) voltage of FIG. 18 by using the clock CLKd. Each of the first pulse width control circuit and the second pulse width control circuit may be implemented by using various elements, such as a flip-flop and a logic gate in accordance with some example embodiments of the inventive concept.

For brevity of illustration and for convenience of description, a rising edge of a first pulse of the clock signal CLK, a rising edge of a first pulse of the divided clock signal CLKd, and a time point when the word line WL, the bit line BL, and the source line SL are driven are illustrated in FIG. 18 as being identical to "t0". In practice, latency according to signal processing, transfer, and driving may skew the timing of these events from each other.

Figure 19:
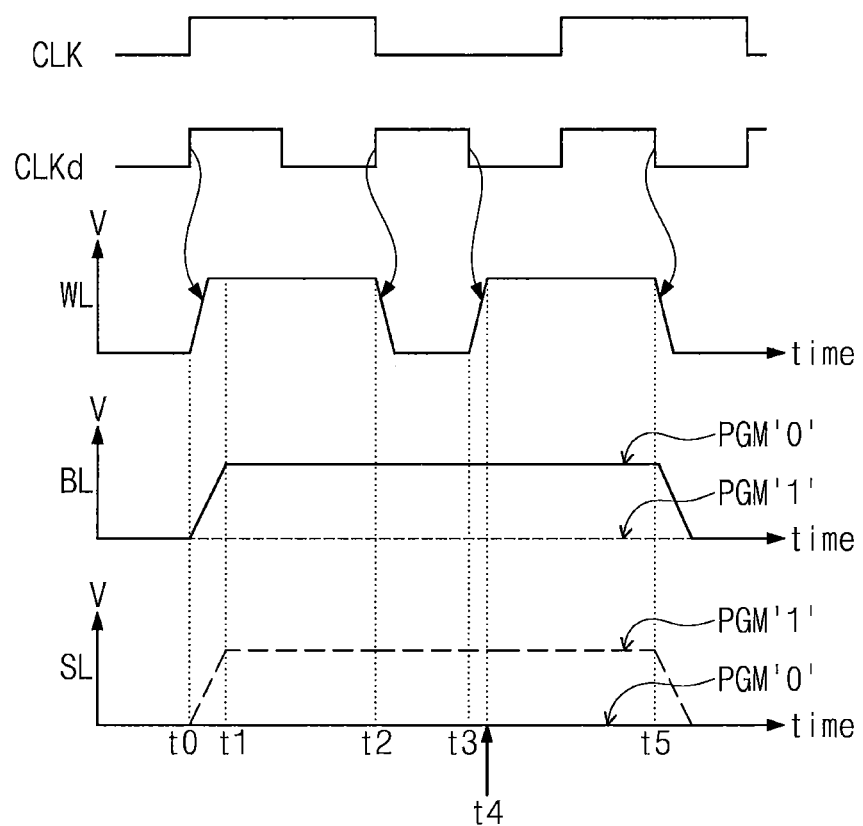
FIG. 19 is a diagram illustrating a programming method according to an example embodiment of the inventive concept.

FIG. 19 is a diagram illustrating a programming method according to an example embodiment of the inventive concept. The embodiment of FIG. 19 is mostly similar to the embodiment of FIG. 18. However, in a time interval between an end of the first program operation and a start of the second program operation, a voltage of the bit line BL and a voltage of the source line SL are maintained at a voltage level corresponding to logic "1," i.e., a high voltage level in contrast with a ground voltage level.

In an embodiment, the row decoder 220 may include a pulse width control circuit (not illustrated) for generating a word line (WL) voltage of FIG. 18 by using the clock signal CLKd. The pulse width control circuit may be implemented by using various elements, such as a flip-flop and a logic gate in accordance with some example embodiments of the inventive concept. However, because the voltage of the bit line BL and the voltage of the source line SL are maintained at their voltage levels throughout both programming operations, the write driver and sense amplifier 240 may not include a pulse width control circuit unlike the row decoder 220.

In the embodiment of FIG. 19, an operation of programming logic "1" or logic "0" to decrease the write error rate WER is described with reference to the above embodiments, and, thus, duplicated description will be omitted in the interest of brevity.

Figure 20:
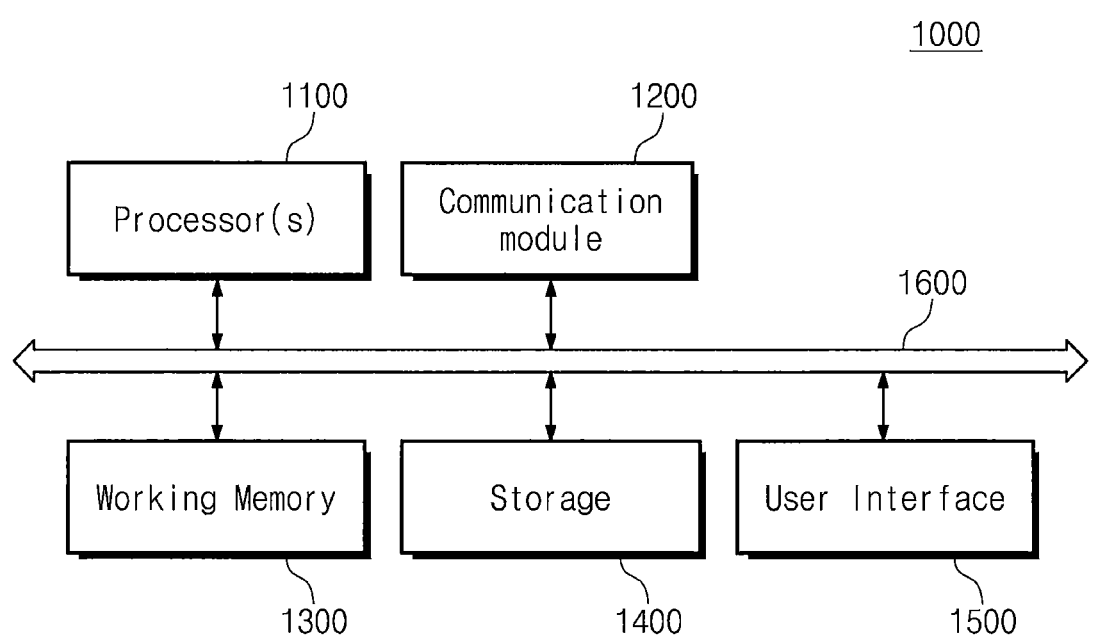
FIG. 20 is a diagram illustrating an electronic system including storage and/or a working memory including a memory device according to an example embodiment of the inventive concept.

FIG. 20 is a diagram illustrating an electronic system 1000 including storage 1400 and/or a working memory 1300 implemented with a memory device according to an example embodiment of the inventive concept.

The electronic system 1000 may include at least one processor 1100, a communication module 1200, a working memory 1300, storage 1400, a user interface 1500, and a bus 1600. For example, the electronic system 1000 may be an electronic device, such as a desktop computer, a laptop computer, a tablet, a smartphone, a wearable device, a video game console, a workstation, a server, and an electric vehicle.

The processor 1100 may control overall operations of the electronic system 1000. The processor 1100 may process various kinds of arithmetic operations and/or logical operations. To this end, the processor 1100 may include an application specific integrated circuit (ASIC), a field-programmable gate array (FPGA), a dedicated microprocessor, a microprocessor, etc. For example, the processor 1100 may include one or more processor cores and may be implemented with a general-purpose processor, a special-purpose processor, or an application processor.

The communication module 1200 may communicate with an external device/system of the electronic system 1000. For example, the communication module 1200 may be a function block, a circuit, or a semiconductor chip manufactured independently of the processor 1100. Alternatively, in the case where the processor 1100 is implemented with an application processor, a function of at least a part of the communication module 1200 may be merged in the application processor 1100.

For example, the communication module 1200 may support at least one of the various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID), and/or at least one of various wired communication protocols such as transfer control protocol/ Internet protocol (TCP/IP), universal serial bus (USB), and Firewire.

The working memory 1300 may store data to be used for operation of the electronic system 1000. For example, the working memory 1300 may temporarily store data processed or to be processed by the processor 1100. For example, the working memory 1300 may include a volatile memory, such as a dynamic random access memory (DRAM) or a synchronous DRAM (SDRAM), and/or a nonvolatile memory, such as a phase-change RAM (PRAM), a magneto-resistive RAM (MRAM), a resistive RAM (ReRAM), or a ferroelectric RAM (FRAM).

The storage 1400 may include one or more memory devices and a controller. The memory devices of the storage 1400 may retain data regardless of power supply. For example, the storage 1400 may include a nonvolatile memory, such as a flash memory, a PRAM, an MRAM, a ReRAM, or an FRAM. For example, the storage 1400 may include a storage medium such as a solid state drive (SSD), removable storage, or embedded storage.

The user interface 1500 may perform communication arbitration between a user and the electronic system 1000. For example, the user interface 1500 may include input interfaces, such as a keyboard, a mouse, a keypad, a button, a touch panel, a touch screen, a touch pad, a touch ball, a camera, a microphone, a gyroscope sensor, and a vibration sensor. For example, the user interface 1500 may include output interfaces, such as a liquid crystal display (LCD) device, a light emitting diode (LED) display device, an organic LED (OLED) display device, an active matrix OLED (AMOLED) display device, a speaker, and a motor.

The bus 1600 may provide a communication path between the components of the electronic system 1000. The components of the electronic system 1000 may exchange data with each other based on a bus format of the bus 1600. For example, the bus format may include one or more of various interface protocols, such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS).

The working memory 1300 and the storage 1400 may be configured to perform at least two consecutive program operations to decrease a write error rate in accordance with one or more of the above-described embodiments. In addition, the working memory 1300 and the storage 1400 may be configured to maintain a bit line voltage or a source line voltage at a substantially constant level between a first program operation and a second program operation. As a result, the write error rate may decrease by using time that conventionally is used to ramp up a bit line or source line voltage for performing a programming operation.

According to example embodiments of the inventive concept, a programming method for markedly decreasing a write error rate of a magnetic memory device may be provided. As a result, the reliability of the memory device may be improved.

In addition, according to example embodiments of the inventive concept, because a write error rate decreases with regard to a defective memory cell, there may be obtained an effect similar to the following: an increase of the quantity of semiconductor devices manufactured (i.e., the increase of the yield).

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. A memory device comprising:
a memory cell array comprising a target cell;
a row decoder configured to drive a word line connected to the target cell with a first driving voltage, in a first program operation and a second program operation; and a write driver and sense amplifier configured to drive a bit line connected to the target cell with a second driving voltage or drive a source line connected to the target cell with a third driving voltage continuously between a start of the first program operation and an end of the second program operation;

wherein the target cell comprises:

a magnetic tunnel junction element having a first end connected to the bit line; and a cell transistor having a first end connected to a second end of the magnetic tunnel junction element and a second end connected to the source line.

2. The memory device of claim 1, wherein the second driving voltage has a voltage level corresponding to logic "1", and the third driving voltage has a voltage level corresponding to logic "0" for programming a logic "0" to the target cell, and wherein the second driving voltage has a voltage level corresponding to logic "0", and the third driving voltage has a voltage level corresponding to logic "1" for programming a logic "1" to the target cell.

3. The memory device of claim 2, wherein the second driving voltage or the third driving voltage is maintained at a substantially constant level between the start of the first program operation and the end of the second program operation.

4. The memory device of claim 2, wherein the second driving voltage has a first level in the first program operation and the second program operation, and wherein the second driving voltage has a second level lower than the first level between an end of the first program operation and a start of the second program operation.

5. The memory device of claim 4, wherein the second level is set within a range in which a programming state of the target cell determined according to a result of the first program operation does not change.

6. The memory device of claim 2, wherein the voltage level corresponding to the logic "0" is a ground voltage.

7. The memory device of claim 2, wherein a level of the second driving voltage is about a same level of the third driving voltage.

8. The memory device of claim 1, further comprising:

a column decoder configured to select the bit line and the source line, which are connected to the target cell.

9. The memory device of claim 1, wherein the magnetic tunnel junction element comprises:

a free layer, a magnetization direction of which varies; and a pinned layer, a magnetization direction of which is pinned.

10. A method for programming a variable resistance memory cell, the method comprising:

maintaining a bit line voltage and a source line voltage continuously through first and second program operations on the variable resistance memory cell that are performed consecutively, but are separated in time.

11. The method of claim 10, wherein the bit line voltage has a voltage level corresponding to logic "1", and the source line voltage has a voltage level corresponding to logic "0" for programming logic "0" to the variable resistance memory cell, and wherein the bit line voltage has a voltage level corresponding to logic "0", and the source line voltage has a voltage level corresponding to logic "1" for programming logic "1" to the variable resistance memory cell.

12. The method of claim 10, wherein maintaining the bit line voltage and the source line voltage through the first and second program operations comprises:

maintaining the bit line voltage at a substantially same level in the first and second program operations; and maintaining the source line voltage at a substantially same level in the first and second program operations.

13. The method of claim 10, wherein the bit line voltage during an interval between the first and second programming operations is maintained at a level lower than the bit line voltage in the first program operation, and wherein the source line voltage during the interval between the first and second programming operations is maintained at a level substantially identical to the source line voltage in the first program operation.

14. The method of claim 10, wherein the variable resistance memory cell comprises:

a magnetic tunnel junction element having a first end connected to the bit line; and a cell transistor having a first end connected to a second end of the magnetic tunnel junction element and a second end connected to the source line.

15. A memory device comprising:

control logic configured to generate a row control signal and a column control signal based on a clock signal and a command;

a divider configured to divide the clock signal;

a memory cell array including a target cell;

a row decoder configured to drive a word line connected to the target cell with a first driving voltage, based on the row control signal and the divided clock signal, in a first program operation and a second program operation; and a write driver and sense amplifier configured to drive a bit line connected to the target cell with a second driving voltage or drive a source line connected to the target cell with a third driving voltage based on the column control signal and the divided clock signal, in the first program operation and the second program operation.

16. The memory device of claim 15, wherein, between an end of the first program operation and a start of the second program operation, the write driver and sense amplifier is further configured to drive the bit line with the second driving voltage or drive the source line with the third driving voltage.

17. The memory device of claim 15, wherein a start of the first program operation corresponds to a rising edge of a first pulse of the divided clock signal, wherein an end of the first program operation corresponds to a rising edge of a second pulse of the divided clock signal, wherein a start of the second program operation corresponds to a falling edge of a second pulse of the divided clock signal, and wherein an end of the second program operation corresponds to a falling edge of a third pulse of the divided clock signal.

18. The memory device of claim 15, wherein the target cell comprises:

a magnetic tunnel junction element having a first end connected to the bit line; and a cell transistor having a first end connected to a second end of the magnetic tunnel junction element and a second end connected to the source line.

19. The memory device of claim 18, wherein the magnetic tunnel junction element comprises:

a free layer, a magnetization direction of which varies; and a pinned layer, a magnetization direction of which is pinned.

* * * * *